(12) United States Patent
Ausserlechner

(10) Patent No.: US 8,400,139 B2
(45) Date of Patent: Mar. 19, 2013

(54) SENSOR PACKAGE HAVING A SENSOR CHIP

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 327 days.

(21) Appl. No.: 12/732,470

(22) Filed: Mar. 26, 2010

(65) Prior Publication Data

US 2011/0234215 A1 Sep. 29, 2011

(51) Int. Cl.
*G01R 15/20* (2006.01)
*G01R 15/28* (2006.01)

(52) U.S. Cl. .................... 324/117 H; 324/126; 324/127

(58) Field of Classification Search .................. None
See application file for complete search history.

(56) References Cited

U.S. PATENT DOCUMENTS

| | | | | |
|---|---|---|---|---|
| 6,404,180 | B1 * | 6/2002 | Haensgen | 324/117 H |
| 6,759,841 | B2 * | 7/2004 | Goto et al. | 324/117 H |
| 2006/0091993 | A1 * | 5/2006 | Shoji | 338/32 R |

FOREIGN PATENT DOCUMENTS

| | | |
|---|---|---|
| DE | 4218883 A1 | 12/1993 |
| DE | 19606458 A1 | 8/1997 |
| DE | 102006026148 A1 | 12/2007 |
| DE | 102006062321 A1 | 7/2008 |

\* cited by examiner

*Primary Examiner* — Vinh Nguyen
(74) *Attorney, Agent, or Firm* — Eschweiler & Associates, LLC

(57) ABSTRACT

Some embodiments herein relate to a sensor package. The sensor package includes a printed circuit board with a laminar current conductor arranged on a first main surface of the printed circuit board. The sensor package also includes a sensor chip adapted to measure a current flowing through the laminar current conductor, wherein the sensor chip comprises a magnetic field sensor. The sensor chip is electrically insulated from the current conductor by the printed circuit board, and is arranged on a second main surface of the printed circuit board opposite to the first main surface. The sensor chip is hermetically sealed between the mold material and the printed circuit board, or is arranged in the printed circuit board and hermetically sealed by the printed circuit board.

18 Claims, 20 Drawing Sheets

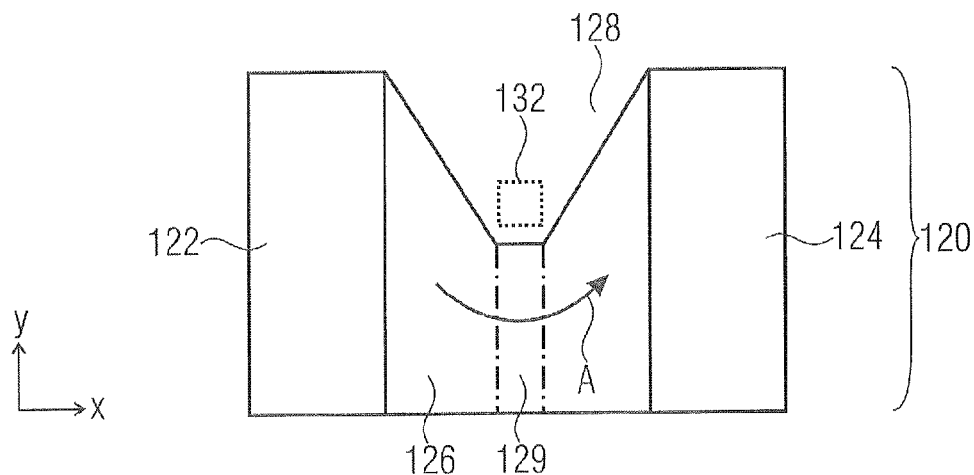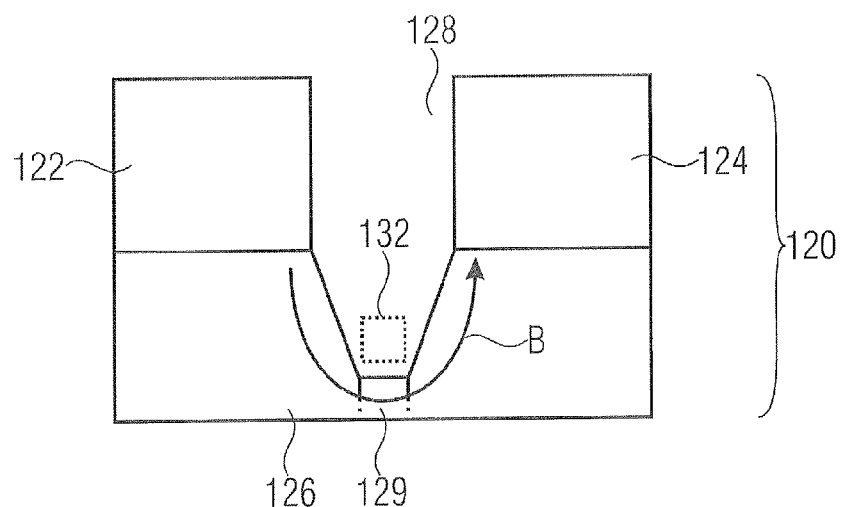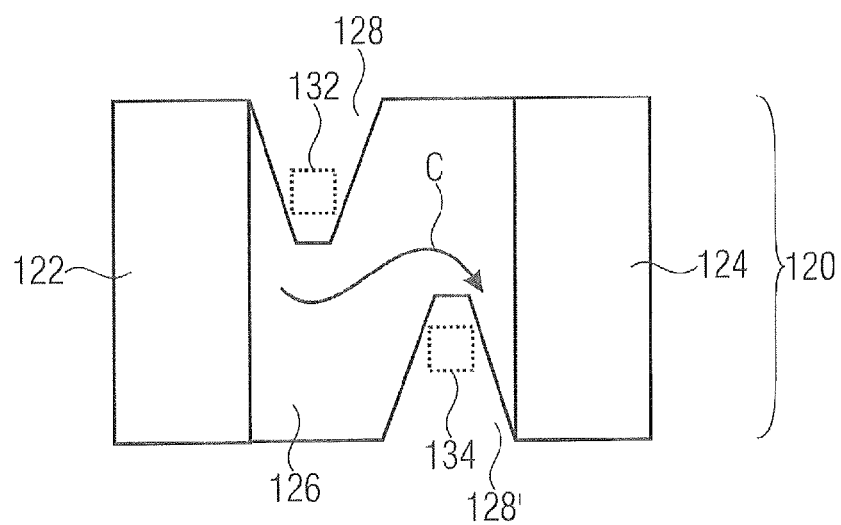
FIG 1B

SENSOR PACKAGE HAVING A SENSOR CHIP

TECHNICAL FIELD

Some embodiments of the present disclosure relate to sensor packages and methods for producing sensor packages, for example sensor packages comprising magnetic field sensors, which sense the magnetic field of a current.

BACKGROUND

Current sensors are used for a variety of applications, for example current limitation, over-current protection or simply for monitoring the intensity of a current. For such applications, Hall-sensors or similar sensors are widely used. Hall-sensors sense the magnetic field of the Current and provide a voltage (Hall voltage) proportional to the intensity of the current. As the magnetic field decreases with increasing distance between the magnetic field sensor and the current, the semiconductor die comprising the Hall-sensor has to be brought close to the conductor carrying the current to be measured to have a sufficiently strong magnetic field.

U.S. Patent Publication No. 2008/0297138 A1 describes a current sensor with lead frames forming a current conductor portion and a substrate comprising a magnetic field sensing element arranged above a current conductor portion provided by the lead frame to measure the current flowing through the current conductor portion. Also U.S. Pat. No. 7,166,807 B2 and U.S. Pat. No. 6,995,315 B2 describe current sensors with magnetic field sensors based on the lead frame technology as structural-design technology.

U.S. Pat. No. 5,041,780 describes an integrable current sensor, wherein a current conductor is provided on top of a semiconductor substrate comprising the magnetic field sensing elements. A further example of a semiconductor device with a Hall-effect element and a conductor arranged on top of the semiconductor substrate is described in U.S. Pat. No. 6,424,018 B1.

Current sensors based on lead frame structures or semiconductor carriers or ceramic carriers cause high costs with regard to the material and with regard to the production processing. Furthermore, the current to be measured produces eddy currents in neighboring conductors or conductive layers, for example used as electrostatic shields, wherein the eddy currents in return produce magnetic fields that superimpose to the magnetic field of the current to be measured, and thus deteriorate the sensitivity and the calibration of the current measurement of the sensor.

German Patent publication DE 10 2006 026 148 A1 describes an electronic device comprising a load current path consisting of two conductor traces arranged on top of each other in a multi-layer printed circuit board and insulated by the printed circuit board from each other. The device further comprises a Hall-sensor arranged below the printed circuit board and the two conductor traces for a current measurement of the load current path. The Hall-sensor is electrically connected to a measurement evaluation unit via conductor traces on the lower surface of the printed circuit board. Current sensor arrangements as described in German Patent publication DE 10 2006 026 148 A1 are expensive to produce, expensive to test, only show a limited measurement sensitivity, which additionally deteriorates over the lifetime of the electronic device.

SUMMARY

The following presents a simplified summary in order to provide a basic understanding of some aspects of the invention. This summary is not an extensive overview of the invention, and is neither intended to identify key or critical elements of the invention nor to delineate the scope of the invention. Rather, the purpose of the summary is to present some concepts in a simplified form as a prelude to the more detailed description of different embodiments presented later.

Embodiments of the present invention provide a sensor package, comprising: a printed circuit board with a laminar current conductor arranged on a first main surface of the printed circuit board; a sensor chip adapted to measure a current flowing through the laminar current conductor, wherein the sensor chip comprises a magnetic field sensor, wherein the sensor chip is electrically insulated from the current conductor by the printed circuit board, and wherein the sensor chip is arranged on a second main surface of the printed circuit board opposite to the first main surface and is hermetically sealed between a mold material and the printed circuit board, or wherein the sensor semiconductor die is arranged in the printed circuit board and is hermetically sealed by the printed circuit board.

Further embodiments of the present invention provide a method for producing a sensor package, the method comprising: providing a printed circuit board with a laminar current conductor arranged on a first main surface of the printed circuit board; providing a sensor chip adapted to measure a current flowing through the laminar current conductor, wherein the sensor chip comprises a magnetic field sensor; arranging the sensor chip on a second main surface of the printed circuit board opposite to the first main surface such that the sensor chip is electrically insulated by the printed circuit board from the current conductor; and hermetically sealing the sensor chip between a mold material and a printed circuit board; or arranging a sensor chip in the printed circuit board such that the sensor chip is electrically insulated by the printed circuit board from the current conductor and such that the sensor chip is hermetically sealed.

Current sensors for measuring a current based on the magnetic field produced by the current to be measured typically comprise (a) a current conductor for the current to be measured, (b) a semiconductor die or chip with magnetic field sensors arranged close to the current conductor, and (c) a voltage insulation between the current conductor and the semiconductor die. The current conductor for the current to be measured is also referred to as primary conductor and the current to be measured also as primary current.

Embodiments of the present invention provide a printed circuit board package (PCB package) comprising a printed circuit board that is arranged between a semiconductor die or semiconductor chip comprising one or more core-less magnetic field sensors on one side of the printed circuit board and the current conductor or primary conductor for the current to be measured. The printed circuit board serves as mechanical carrier of the package (in particular during the production and, thus replaces conventional mounting technologies using lead frames, semiconductor substrates or ceramic substrates as mechanical carriers during the production) and at the same time insulates the sensor chip, also referred to as sensor semiconductor die, and the current conductor from each other. The sensor chip is hermetically sealed from the environment by the printed circuit board and an additional mold material, wherein the sensor chip may be partially embedded in the printed circuit board, e.g. in recesses in the printed circuit board. In alternative embodiments sensor chip is hermetically sealed from the environment by the printed circuit board alone, e.g. is completely embedded in the printed circuit board, e.g. in a multi-layer printed circuit board.

Embodiments of the sensor package can be produced more cost efficient than conventional sensors with ceramic carriers, semiconductor carriers or massive copper lead frames, both because their raw material is more expensive than printed circuit board material and because the processing, e.g. cutting, milling, drilling, punching, trimming, etc., is more expensive than the processing of printed circuit board sensor packages. In addition, there are inexpensive methods available to accurately coat large panels of printed circuit boards with solder paste or die attach or epoxy adhesives or insulating varnishes via ink-jet machines.

Furthermore, the conducting layers can be made more accurately by well established manufacturing techniques for printed circuit board production. Particularly the alignment of the sensor chip and the current conductor on opposite sides of the printed circuit board can be performed more accurately using alignment structures or alignment marks on the top of the printed circuit board layer, for example, on the surface of the printed circuit board onto which the sensor chip is to be mounted. Similar alignment structures or marks are not known for lead frame, semiconductor or ceramic carrier based production technologies.

The printed circuit board can fulfill multiple purposes or tasks. It can serve as mechanical support of the sensor chip, as a voltage insulation between the sensor chip and the current conductor, and as a contacting means for the sensor chip, for example by providing the conductor traces on a surface of the printed circuit board facing towards the sensor chip or, for example in multi-layer printed circuit board designs, inside the printed circuit board. In addition, the printed circuit board can hold the current conductor and the sensor chip or sensor elements in a well defined, stable distance, which helps to ensure a low lifetime drift of the current sensor. Core-less magnetic current sensors are very sensitive with regard to changes in their position or with regard to the distance to the conductor whose current is to be measured. In contrast to magnetic current sensors comprising a core as macroscopic flux concentrator, core-less magnetic current sensors have no macroscopic flux concentrator which collects the flux around a conductor and guides it onto the magnetic field sensor element. By hermetically sealing the sensor chip in the sensor package, or in other words by completely surrounding the sensor chip by the printed circuit board material or the printed circuit board material and the mold material, warpage due to moisture or other environmental conditions of the sensor chip during the lifetime of the sensor package is avoided or at least reduced, and, thus, also a change of the vertical distance of the sensor chip and the current conductor. Warpage of the sensor chip leads to a change of the vertical distance between the sensor chip and the magnetic field sensor with regard to the current conductor and, thus, to a deterioration or degradation of the measurement, signal, or in other words to a drift between the measured current intensity output by the sensor package and the actual current over lifetime. By avoiding or reducing the possibility of warpage, embodiments of the sensor package increase the reliability of the sensor package and the correctness of the measured current intensity.

In addition, conductor traces of the printed circuit board can be patterned accurately with well established, cost efficient and reliable production techniques known for printed circuit board production, for example etching. In particular, current conductors with fine slots, i.e. slots with very small dimensions, can be cost-efficiently and reliably produced.

Embodiments of the sensor package can comprise printed circuit boards void of magnetic components which would distort the magnetic field (PCBs commonly use high purity copper for their traces) and reduce the stability and accuracy of the current sensor.

Embodiments of the sensor package can, furthermore, comprise thin conductive traces to serve as electrostatic shield and to contact the sensor chip or sensor semiconductor die, and there is no need for other conductive parts in the printed circuit board, which avoids eddy currents induced in the conductive parts by the magnetic field of the current to be measured, which would reduce the bandwidth of the sensor.

Besides, printed circuit boards for high temperature operations or applications are known. The problem of high temperatures is a common problem in current sensors due to dissipation caused by the large primary current in the current conductor, in particular in the case of an over-current. The flame retardant properties of the FR4 family of the printed circuit board materials can be used to overcome for example, the high temperature problem mentioned above.

Well known technologies for implementing contact regions on the printed circuit board to connect the sense pins of the sensors or the sensor chip, i.e. all contacts except the ones for the primary current, can be used.

Printed circuit board packages are light weighted and mechanically rigid, yet not brittle.

In addition, the technology of printed circuit board production is mature also in the sense that it avoids peeling off of the conducting layers and traces of the printed circuit board layer. This is a major risk for current sensors due to the combined action of thermo-mechanic, hygro-mechanic and electromagnetic forces at high currents, particularly in the case of impulse loads (thermal cycling and mechanical cycling). The current flowing through the current conductor exerts a considerable force on the current conductor or conducting layer, which is proportional to the square of the current amplitude. This force produced by the current tries to open up slots in the conducting layer produced to increase the intensity of the magnetic field by reducing the cross-section of the current conductor.

Finally, most printed circuit board materials have low relative dielectric constants of around 4.5. Low dielectric constants keep the unwanted capacitive crosstalk from the primary current layer or current conductor to the sensor chip small.

BRIEF DESCRIPTION OF THE DRAWINGS

Embodiments of the present invention are described herein making reference to the appended drawings.

FIG. 1B shows top-views of structured current conductors comprising a reduced cross section.

Figure 1A:
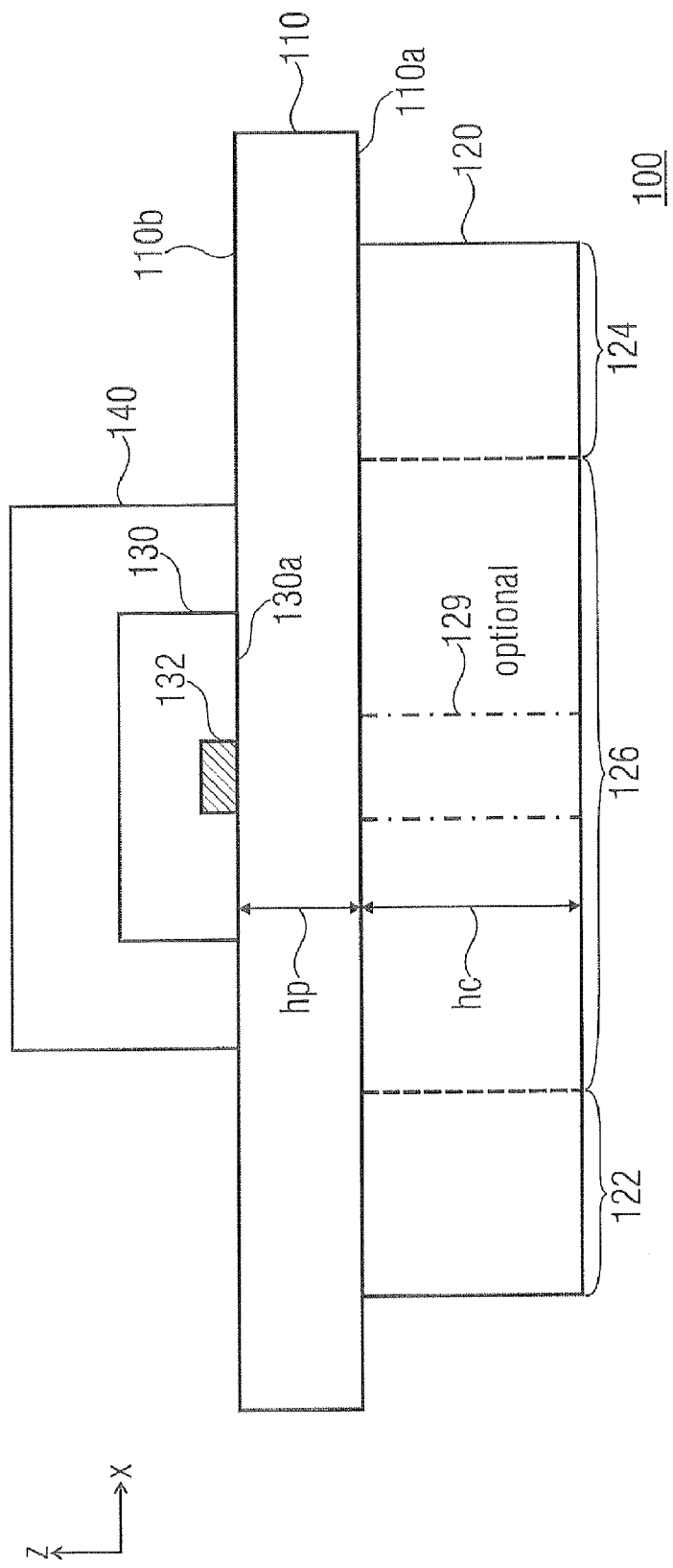
FIG. 1A shows a schematic cross-section of an embodiment of a sensor package, wherein the sensor chip is hermetically sealed between the printed circuit board and a mold body.

Equal or equivalent elements or elements with equal or equivalent functionality are denoted in the following description by equal or equivalent reference numerals.

DETAILED DESCRIPTION

Some aspects of the present disclosure are now set forth with regards to the figures. It will be appreciated that all numerical references (e.g., currents, voltages, lengths) are merely examples and do no limit the scope of the invention in any way. Also, all of these numerical values are only approximations, and actual values from vary from those explicitly set forth herein.

FIG. 1A shows a schematic cross-sectional view of an embodiment of a sensor package 100 comprising a printed circuit board 110 with a laminar current conductor 120 arranged on a first main surface 110a of the printed circuit board, wherein a sensor chip 130 is adapted to measure a current flowing through the laminar current conductor 120. The sensor chip 130 comprises a magnetic field sensor 132 and optionally an evaluation unit (not shown). The sensor chip 130 is arranged on a second main surface 110b of the printed circuit board opposite to the first main surface 110a. The surfaces of the sensor chip 130 not covered by the printed circuit board 110 (in FIG. 1A the side surfaces and the main surface facing away from the printed circuit board) are covered by a mold body 140 comprising a mold material. Thus, the sensor chip 130 is arranged between the mold body 140 and the printed circuit board 110, wherein the mold body 140 and the printed circuit board 110 are arranged such around the sensor chip that the sensor chip 130 is hermetically sealed from the environment. In other words, the mold body 140 is arranged on the second main surface 110b of the printed circuit board and/or around the sensor chip 130 such that the sensor chip 130 is arranged between the mold body 140 and the printed circuit board and is completely surrounded by the mold body 140 and the printed circuit board 110. The current conductor 120 comprises, for example, a first contact region 122, a second contact region 124 and a magnetic field producing region 126 arranged between the first contact region 122 and the second contact region 124 and electrically connecting both. The sensor chip 130 and the magnetic field sensor 132 are associated to the current conductor 120 or the magnetic field producing region 126 and are adapted to measure a current flowing through the current conductor 120, for example from the first contact region 122 via the magnetic field producing region 126 to the second contact region 124, by measuring the magnetic field produced by the current. The current conductor 120 is also referred to as primary conductor and the current flowing through the current conductor is also referred to as primary current. Note also that PCB 110 overlaps the sensor chip or die 130 along its entire perimeter by several tenths of a milli-meter in order to guarantee a long enough creepage distance between conductor 120 and die 130 for the purpose of voltage isolation.

Embodiments of the sensor package can be easily mounted on external and conventional circuit boards and connected to the conductors to be measured via the first and second contact region.

FIGS. 1A to 1D and the other figures show the respective axis 5' of an x-y-z coordinate-system, wherein the x-axis and the y-axis define a lateral plane or lateral dimensions parallel to the first main surface 110a of the printed circuit board, and wherein the z-axis defines a vertical dimension vertical to the first main surface 110a of the printed circuit board.

FIG. 1B shows schematic top-views of three different embodiments of a structured current conductor 120. The embodiment of the current conductor 120 shown in the top of FIG. 1B shows a patterned current conductor 120 with a lateral notch 128 in the magnetic field producing region 126 defining a laterally reduced cross-section 129 (note that 126 is larger than 129, actually 129 is a part of 126). The reduced cross-section forms an area within the magnetic field producing region 126 which has a reduced cross-section forcing the current flowing from the first contact region 122 to the second contact region 124 to flow "I"-shaped (see arrow A). The reduced cross-section and the bending of the current flow A caused by the notch 128 increases the current density at the reduced cross-section (in particular at the inner side of the curve arranged nearer to magnetic field sensor 132) and, thus, the magnetic field strength of the magnetic field produced by the current at the reduced cross-section. This allows to increase the sensitivity of the current measurement. A possible lateral position of a magnetic field sensor element 132 of the sensor chip 130 for measuring the magnetic field of the current is shown by dotted lines.

The embodiment of the current conductor 120 shown in the middle of FIG. 1B shows a "U"-shaped current flow (see arrow B). Similar to the aforementioned embodiment, the current conductor comprises a lateral notch 128 in the magnetic field producing region and between the first contact region and the second contact region. However, in this embodiment the first and second contact region 122 and 124 are arranged only on an opposite half of the current conductor, opposite to the reduced cross-section 129 in the magnetic field producing region 126. Thus, the current flowing from the first contact region 122 to the second contact region 124 is even more bent than in the aforementioned embodiment. In addition, the cross-section 129 of the embodiment shown in the middle of FIG. 1B is smaller than the cross-section 129 of the embodiment shown on the top of FIG. 1B, and, thus, even further increases the magnetic field strength of the magnetic field produced by the current. Again an exemplary position of a magnetic field sensor 132 is shown.

The embodiment shown in the bottom of FIG. 1B shows a current conductor with an "S"-shaped current flow (see arrow C). To achieve the S-shaped current flow the magnetic field producing region 126 comprises two notches arranged on opposite sides of the magnetic field producing region 126 relative to the flow direction of the current and displaced or offset to each other in flow direction. In each of the notches 128, 128' a magnetic field sensor 132, 134 can be arranged to measure the magnetic field of the current. The use of two or more magnetic field sensors 132, 134 allows to use differential magnetic field measurements which compared to single magnetic field sensor measurements provide improved sensitivity and signal robustness.

As can be seen from FIGS. 1A and 1B, the global direction of the current flow of the patterned conducting layer 120 may be horizontal with regard to FIG. 1A or into the drawing plane of FIG. 1A or in any other direction parallel to the first main surface 110a of the printed circuit board and parallel to the first main surface 130a of the sensor chip 130 facing towards the printed circuit board and the current conductor 120. In other words, a current to be measured flows within the x-y plane parallel to the first main surface 130a of the sensor chip 130 from the first contact region to the second contact region. The arrows A to C in FIG. 1B show the flow of the current when the current or primary current is input at the first contact region 122 and is output at the second contact region 124.

Even further embodiments of the current conductor 120 may comprise other patterns and/or any number of and any form of slots or notches arranged on any of the two opposite sides (with regard to the flow direction) of the magnetic field producing area 126 to bend the current and/or to provide reduced cross-sections to increase the current density. The important aspect is that at least one notch 128 is present in the primary conductor and that at least one magnetic field sensor element 132 is to be aligned with high precision (e.g. +/−150 μm or preferably even down to +/−10 μm in lateral direction and +/−5 μm or preferably down to +/−50 μm in vertical direction) with respect to the notch.

Although such structured magnetic field producing regions 126 allow to improve the sensitivity of the current measurement, simple embodiments of the current conductor may also comprise a rectangular magnetic field producing region 126 without any notches or other structures which combines the first contact region 122 and the second contact region 124.

The first and second contact regions 122, 124 may have the same thickness or vertical dimension (thickness of the conductor layer or height hc) as the magnetic field producing region 126, or may have a different height. Embodiments of the sensor package can comprise, for example thicker contact regions 122, 124 (larger vertical dimension) and a thinner magnetic field producing region 126 (smaller vertical dimension) in order to increase the current intensity in the magnetic field producing region 126 and, thus, the magnetic field onto the magnetic field sensors while keeping the internal resistance at a minimum.

Embodiments of the sensor chip may comprise only one single magnetic field sensor 132 as a single magnetic field sensor 132 is sufficient to detect a magnetic field of a current flowing through a conducting layer 120. Other embodiments comprise at least two magnetic field sensors 132, 134 to realize a differential measuring principle which allows to suppress magnetic background disturbances.

Figure 1C:
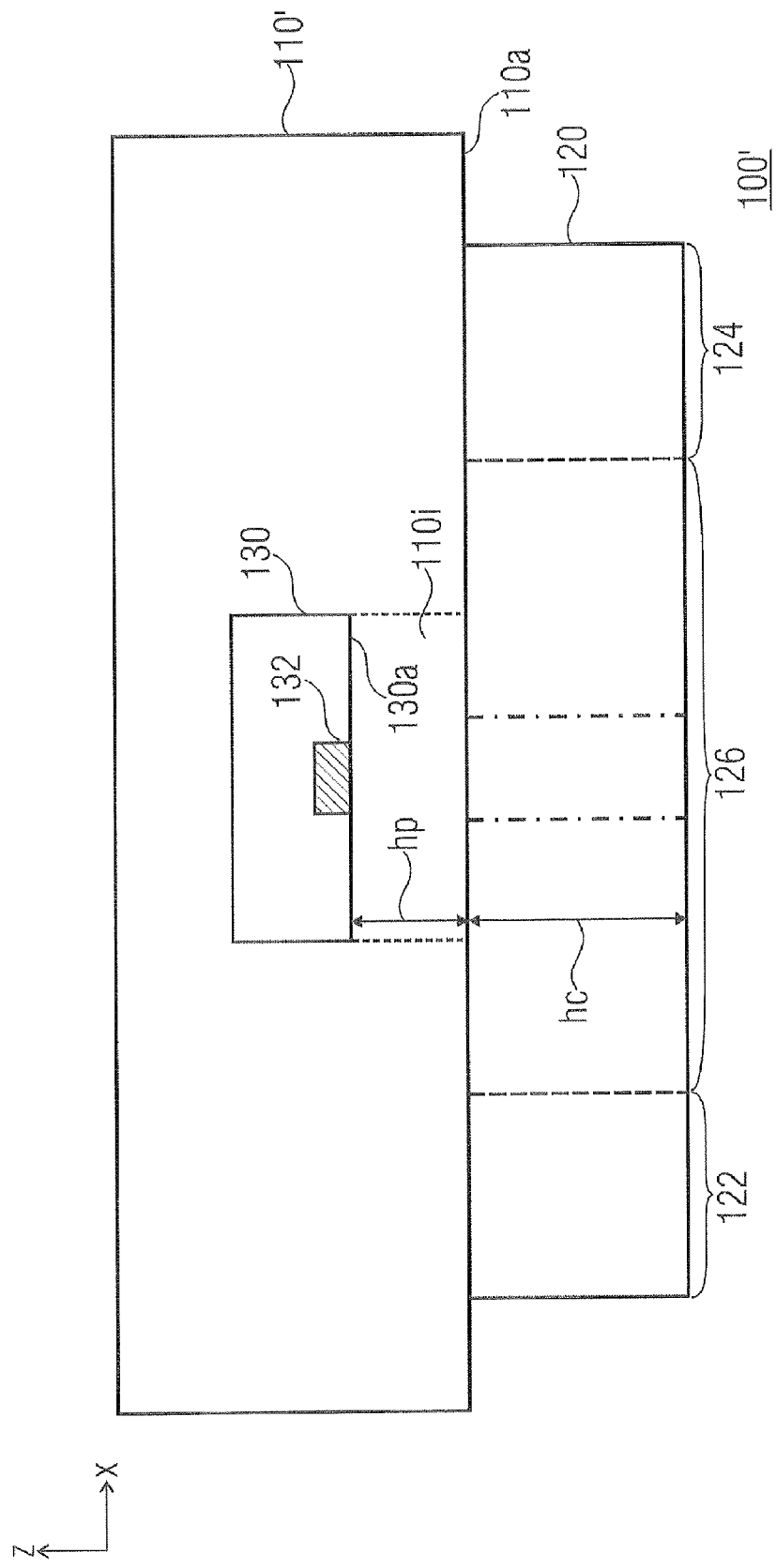
FIG. 1C shows a schematic cross-section of an embodiment of a sensor package, wherein the sensor chip is hermetically sealed by the printed circuit board package.

As shown in FIG. 1A, the sensor chip 130 can be protected from the environment by over-molding it. According to an alternative embodiment the sensor chip 130 can be protected from the environment by embedding it into the printed circuit board 110' as shown in FIG. 1C. FIG. 1C shows a cross-sectional view of the alternative embodiment, wherein the sensor chip is arranged in the printed circuit board 110 and is hermetically sealed by the printed circuit board. The embedding into the printed circuit board 110 can, for example, be achieved by providing a base printed circuit board 110 as shown in FIG. 1A and arranging one or several other printed circuit boards on the base printed circuit board 110 of FIG. 1A (multi-layer printed circuit board), wherein the printed circuit board layer or printed circuit board abutting on the second main surface 110b comprises a cavity on the surface facing towards the base printed circuit board 110 to incorporate the sensor chip 130. Thus, the semiconductor die or sensor chip 130 is embedded between several layers of printed circuit board material as shown in FIG. 1C.

Figure 1D:
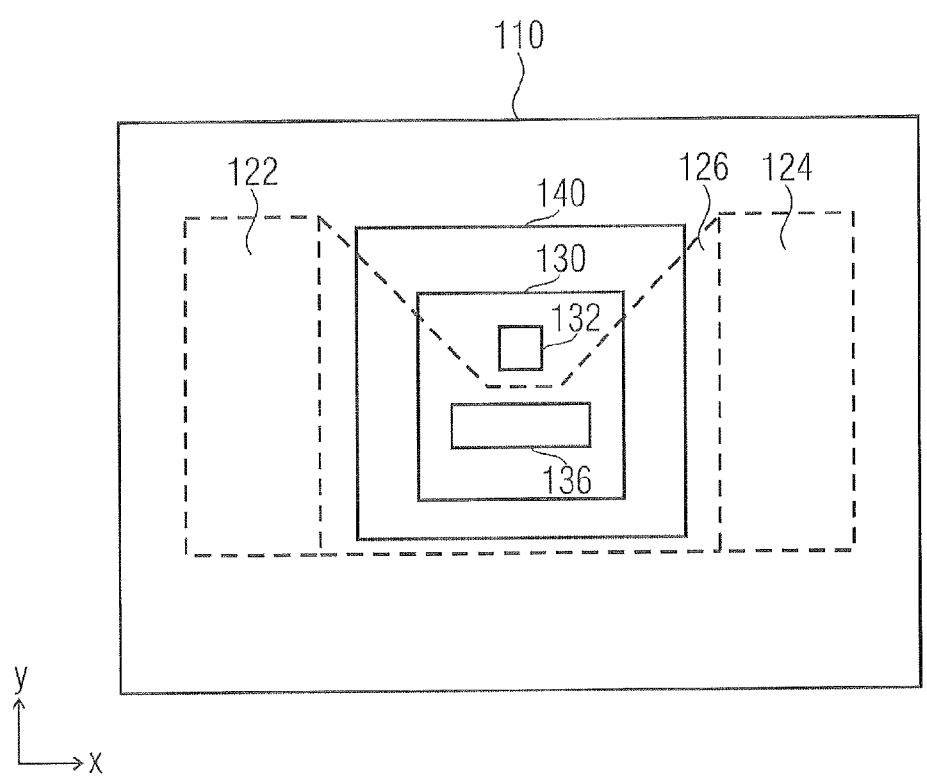
FIG. 1D shows a schematic top-view of a sensor package according to FIG. 1A and a current conductor for an I-shaped current flow.

FIG. 1D shows a schematic top-view of an embodiment according to FIG. 1A with a structured current conductor 120 according to the embodiment shown in the top of FIG. 1B. FIG. 1D shows the printed circuit board 110 with the sensor chip 130 and the mold body 140 arranged on the second main surface (upper main surface according to the orientation of FIG. 1A) and the current conductor 120 (broken lines) arranged on the first main surface (lower surface according to the orientation of FIG. 1A). The current conductor 120 comprises the first contact region 122, the second contact region 124 and the magnetic field producing region 126 with a notch 129 on one side along the current flow direction defining a reduced cross-section 129, as explained based on FIG. 1B. The sensor chip 130 comprises a single magnetic field sensor 132 arranged above the notch 129 and laterally aligned to the notch 129, and the evaluation unit 136 electrically coupled to the magnetic field sensor 132 to evaluate the measurement signals of the magnetic field sensor (connecting lines between the magnetic field sensor 132 and the evaluation unit 136, or supply lines and signal lines for outputting the measured signals by the evaluation unit 136 are not shown).

When a current flows through the current conductor 120, the current produces a radial magnetic field (radial to the current flow direction) which is measured by the magnetic field sensor. The magnetic field sensor can be for example, a Hall-sensor or magnetoresistive transducer, which provides, for example, a voltage signal proportional to the magnetic field strength. As the relation between the current, the magnetic field produced by the current and the voltage signal provided by the magnetic fields sensor based on the measured magnetic field is known, the voltage signal provided by the magnetic field sensor 132 can be mapped to a corresponding current value by the evaluation unit 136, in certain embodiments using a calibrations means, e.g. a calibration table or a calibration function, or in general a calibration information or calibration data, to reduce a deviation between the measured current intensity value according to the signal provided by the magnetic field sensor and the actual current intensity value of the current. The calibration data can, e.g., include values indicating how many mT (T=Tesla) magnetic field are produced by a current of 1 A.

To achieve an optimum measurement, the magnetic field sensor 132 is arranged near to the reduced cross-section, preferably vertically above the notch and near to the reduced cross-section (see also FIG. 1A showing in hash-dotted lines the optional reduced cross-section and the lateral alignment of the magnetic field sensor 132 with regard to the notch or reduced cross-section). FIG. 1D shows the PCB overlapping both the sensor chip and the primary conductor. In other embodiments the PCB overlaps only the sensor chip, yet not the conductor: the PCB may be small enough that both contact areas 122, 124 extend beyond it so that they may be contacted on their top or bottom surfaces (or even on both).

In certain embodiments, the thickness or vertical dimension hp of the printed circuit board 110 right underneath the sensor chip 130, or in other words, the vertical dimension of the insulating area of the printed circuit board 110 arranged between the sensor chip 130 and the current conductor 120 for insulating both from each other, is smaller than a vertical dimension hc (thickness or height) of the current conductor or the magnetic field producing region 126 right underneath the sensor chip 130. It has been found that the magnetic field of the current conductor decays versus the vertical distance between the current conductor and the magnetic field sensor or sensor chip and the spatial rate of decay scales with the thickness or vertical dimension of the conducting layer hc. Therefore, embodiments of the sensor body comprise printed circuit boards with a vertical dimension hp of the printed circuit board (at least in the area arranged between the sensor chip and the current conductor insulating the two from each other) being smaller than a vertical dimension hc of the magnetic field producing region 126 of the current conductor, so that a significant amount of magnetic field reaches up to the magnetic field sensors 132, 134.

Figure 9A:
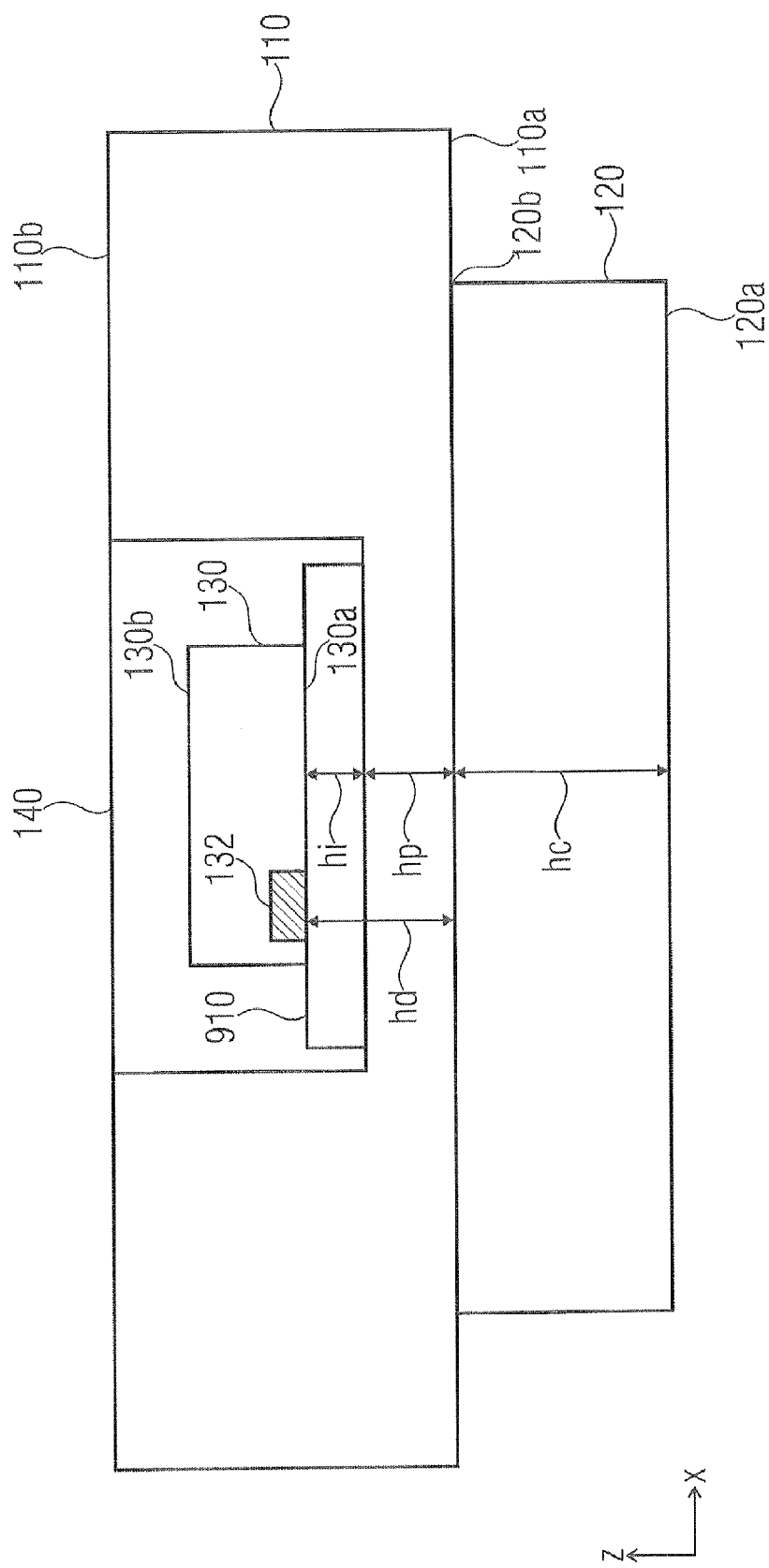
FIG. 9A shows a schematic cross-sectional view of an embodiment of the sensor package with a flip-chip mounted sensor chip and an additional insulation layer between the sensor chip and the printed circuit board.
Figure 9B:
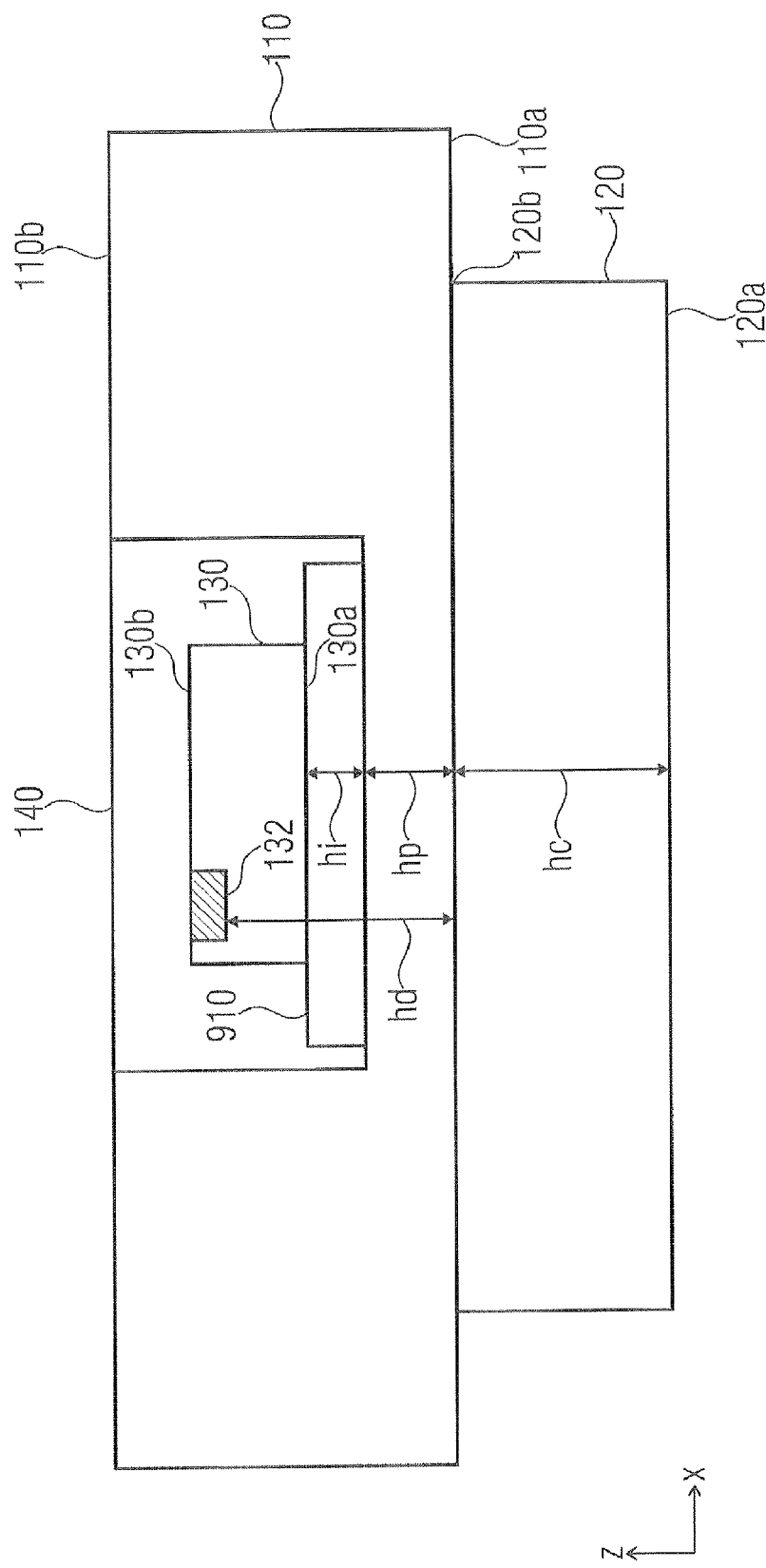
FIG. 9B shows a schematic cross-sectional view of an embodiment of the sensor package with a face-up mounted sensor chip and an additional insulation layer between the sensor chip and the printed circuit board.

Embodiments of the sensor package, however, may comprise not only the printed circuit board as insulating layer between the sensor chip and the current conductor (like in FIGS. 1A, 1C and 2) but may also comprise further insulating layers or other layers arranged between the sensor chip and the current conductor (see FIGS. 9A and 9B). In addition, the current sensors may be flip-chip mounted (top-down, e.g. with the magnetic field sensor arranged near or at the main surface of the sensor chip facing toward the current conductor) or face-up (e.g. with the magnetic field sensor arranged near or at the main surface of the sensor chip facing away from the current conductor). Therefore, in general, for certain embodiments the vertical dimension hc of the magnetic field producing region vertical to the first main surface of the printed circuit board is larger than a vertical distance hd vertical to the first main surface of the printed circuit board between one or all magnetic field sensors associated to the current conductor and comprised in the sensor chip and a surface of the current conductor, and in particular of the magnetic field producing region, facing towards the sensor chip or magnetic field sensor. The vertical dimension hc of the magnetic field producing region can be more than 1.5 times larger or more than 2 times larger than the vertical distance hd between the magnetic field sensor and the current conductor. In further embodiments of the current sensor the magnetic field sensor is arranged such that a vertical distance between the magnetic field sensor and the magnetic field producing region is larger than 50 μm and the vertical dimension of the magnetic field producing region is larger than 100 μm. In even further embodiments of the current sensor the magnetic field sensor is arranged such that a vertical distance between the magnetic field sensor and the magnetic field producing region is larger than 100 μm and the vertical dimension of the magnetic field producing region is larger than 200 μm. In other embodiments, the vertical distance hd between the magnetic field producing region and the magnetic field sensor can be in a range between 50 μm to 200 μm and a vertical dimension of the magnetic field producing region in a range between 70 μm and 400 μm. The aforementioned dimensions and relations apply independent of whether the sensor chip is only insulated from the current conductor by the printed circuit board or by the printed circuit board and one or more other insulating layers, and independent of the vertical position of the magnetic field sensor within the sensor chip relative to the current conductor (see FIGS. 9A and 9B).

In further embodiments, as shown in FIGS. 9A and 9B, the current conductor can be electrically insulated from the sensor chip by an insulating area of the printed circuit board arranged between the sensor chip and the current conductor and an additional insulating layer arranged between the sensor chip and the current conductor, wherein the vertical dimension he of the magnetic field producing region can be larger than a total vertical dimension hi+hp (see FIGS. 9A and 9B) of the insulating area of the printed circuit board and the additional insulating layer.

The vertical dimension hp of the printed circuit board in an area of the printed circuit board arranged between the magnetic field producing region and the sensor chip and the magnetic field producing region can be larger than 50 μm and a vertical dimension of the current conductor larger than 100 μm. In further embodiments, the vertical dimension hp of the printed circuit board in an area of the printed circuit board arranged between the magnetic field producing region and the sensor chip can be larger than 100 μm and the vertical dimension of the current conductor larger than 200 μm. In other embodiments, the vertical dimension hp of the printed circuit board in an area of the printed circuit board arranged between the magnetic field producing region and the sensor chip can be in a range between 50 μm to 200 μm and a vertical dimension of the current conductor in a range between 70 μm and 400 μm.

A current conductor 120 or magnetic field producing region 126 with a vertical dimension he that is larger than a vertical dimension hp of the printed circuit board (see FIG. 1A, wherein the printed circuit board has everywhere the same vertical dimension hp) may lead—over the whole lifetime of the package—to warpage of the whole package and the associated mechanical stress may lead to reliability problems. The risk of warpage can be reduced by keeping the thin part or region 110i of the printed circuit board arranged between the sensor chip 130 and the current conductor 120 as small as possible, or in other words, by keeping the lateral dimensions of the thin intermediate or insulating area 110i of the printed circuit board 110 as small as possible.

Figure 2:
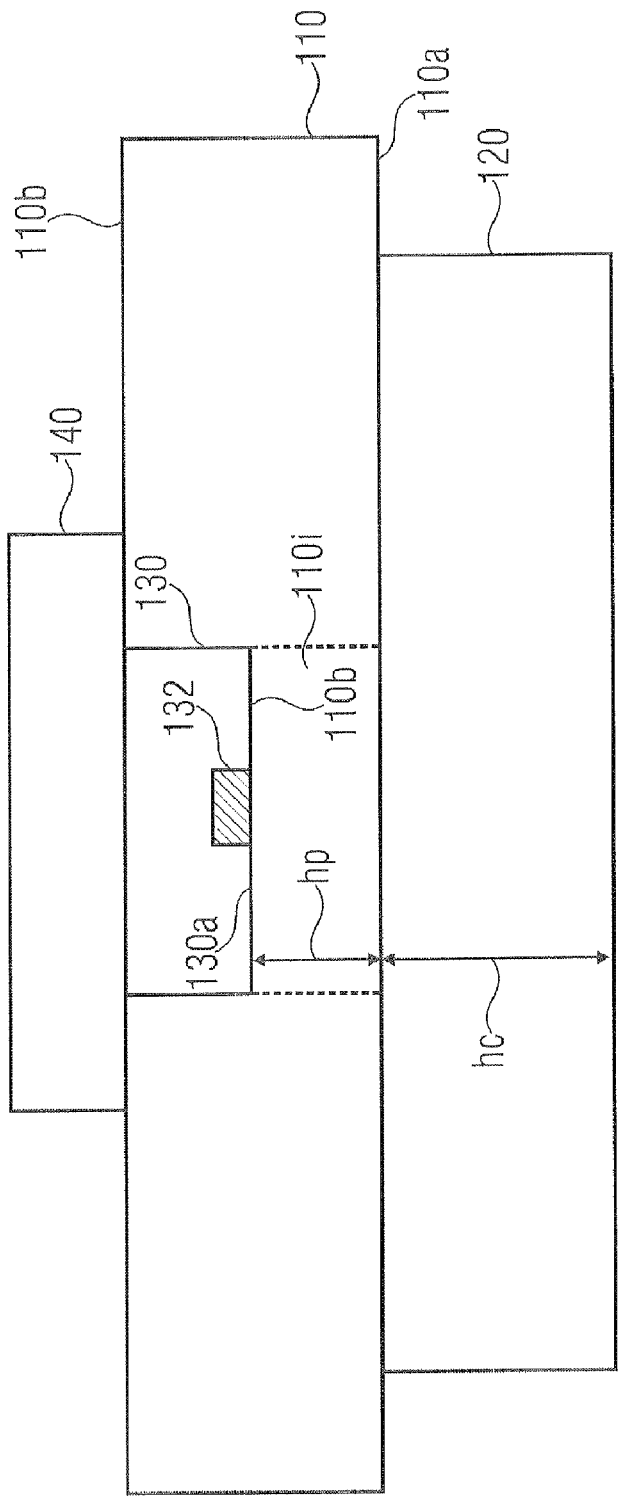
FIG. 2 shows a cross-section of an embodiment of a sensor package similar to the one of FIG. 1A, wherein the sensor chip is partially embedded in the printed circuit board and covered by a mold body.

FIG. 2 shows a schematic cross-sectional view of an embodiment, wherein the printed circuit board 110 comprises at its second main surface 110b a recess to accommodate or contain the sensor chip 130. Thus, the printed circuit board comprises only a small thin insulating area 110i, insulating the sensor chip 130 from the current conductor 120, keeping the distance between the sensor chip and the current conductor at a minimum (defined by the desired insulating voltage and depending on the printed circuit board material) or as small as possible. Thus the position the magnetic field sensor is as close as possible to the current conductor and at the same time, the remaining areas or parts of the printed circuit board 110 (e.g. all parts or regions except 110i) comprise a vertical dimension (thickness or height) sufficient to prevent or at least reduce the risk of warpage of the whole sensor package.

Warpage is even more effectively reduced in FIG. 1C. In this example, if the thickness of the PCB-material above the sensor chip is similar to the thickness hp of the PCB-material below the sensor chip, then the forces of both parts are balanced and the package remains straight.

Figure 3:
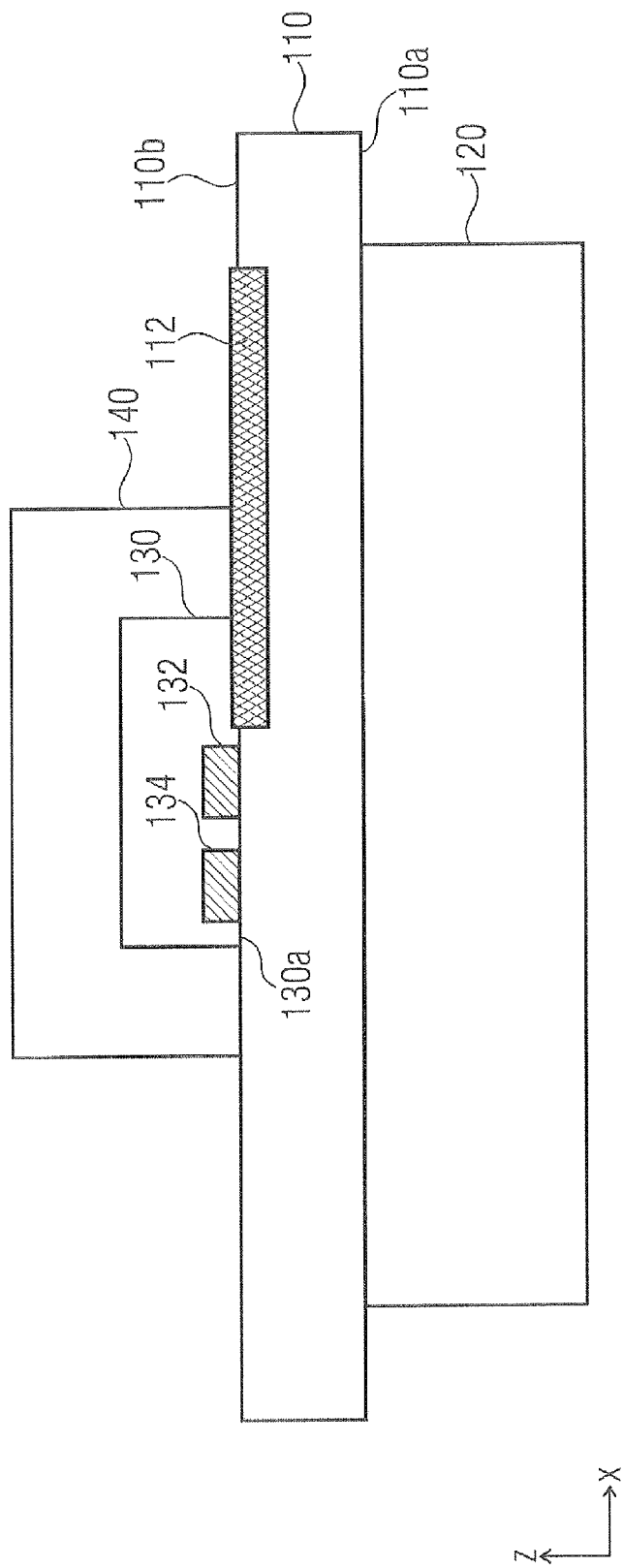
FIG. 3 shows a schematic cross-section of an embodiment according to FIG. 1A with the sensor chip flip-chip mounted on the printed circuit board package.
Figure 4:
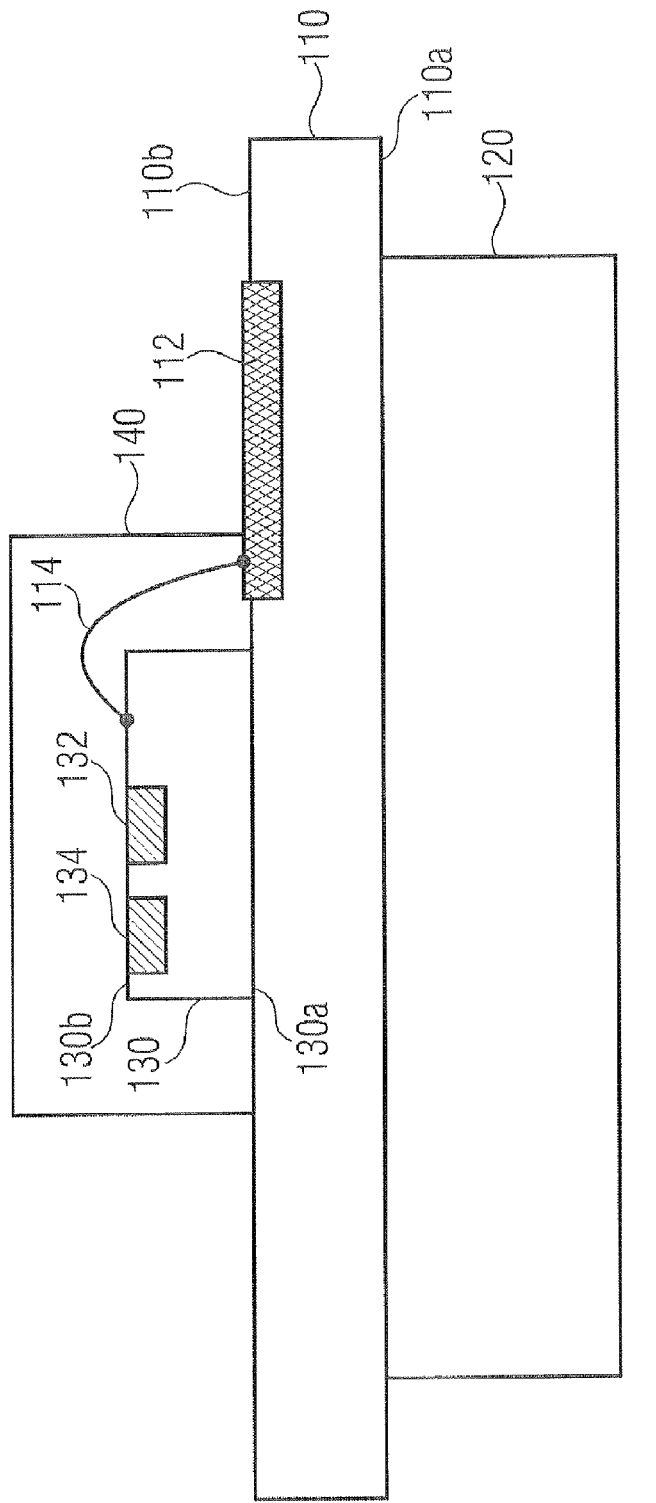
FIG. 4 shows a schematic cross-sectional view of an embodiment according to FIG. 1A with the sensor chip mounted face up on the printed circuit board package.

The magnetic field sensor 132 or the magnetic field sensors 132, 134 can be arranged on the top or the bottom surface of the sensor chip 130. If the magnetic field sensors are arranged on the bottom surface (see FIG. 3) they are exposed to a larger magnetic field than on the top (see FIG. 4), yet this typically involves a flip-chip mounting of the sensor chip or sensor die 130 onto the printed circuit board 110. In FIG. 3 the sensor chip 130 is mounted in a flip-chip style and contacted by thin conductive traces 112 on top of the printed circuit board. In FIG. 4 the sensor chip 130 is mounted with its front side containing the magnetic field sensors 132, 134 up and the contacts are made by bond wires 114.

FIG. 3 shows a schematic cross-sectional view of an embodiment of a sensor package with the sensor chip or semiconductor die 130 arranged face-down on the second main surface 110b of the printed circuit board, for example via flip-chip mounting. The printed circuit board 110 comprises besides the current conductor 120 on the first main surface, further conductor traces or conductive traces 112 on the second main surface 110b to electrically connect the sensor chip 130. As can be seen from FIG. 3, the magnetic field sensors 132, 134 are arranged on the main surface 130a of the sensor chip 130 facing towards the printed circuit board. In addition, the electrical contacts for connecting the sensor chip 130 or semiconductor die 130 to the conductive traces 112 arranged on the second main surface 110b of the printed circuit board (contacts not shown), are also arranged on the main surface 130a of the sensor chip facing toward the printed circuit board. Thus, the magnetic field sensors are as close as possible to the current conductor and at the same time, the electrical connection of the sensor chip, for example for power supply and for the output of the measured signals, can be efficiently and easily provided.

FIG. 4 shows a schematic cross-sectional view of a sensor package, wherein the magnetic field sensors 132, 134 and the electrical contacts for connecting the sensor chip 130 to the conductive traces 112 are arranged on a main surface 130b of the sensor chip facing away from the printed circuit board. The electrical contacts (not shown) of the sensor chip 130 are connected via bond wires 114 to the conductive traces 112. Compared to the flip-chip mounting of FIG. 3, the face up mounting of FIG. 4 facilitates increased reliability and reduced manufacturing costs.

The printed circuit board 110 holds the sensor chip 130 in position (in particular relative to the current conductor) and supports the sensor chip mechanically. Moreover, the printed circuit board establishes a voltage insulation between the sensor chip 130 and the current conductor 120 by the insulating section or area 110i of the printed circuit board. In certain embodiments the printed circuit board overlaps the sensor chip 130 along its entire perimeter (see for example FIGS. 1A and 1D), because even if the sensor chip is coated with some insulating polyimide, oxide or nitride-layer applied before dicing the semiconductor wafer to produce the sensor chip or semiconductor die, this insulation often shows cracks and/or defects along the sewing edge. To protect at least these sawing edges of the sensor chip 130 against the conductor the printed circuit board overlaps the semiconductor chip in each of the lateral dimensions (x-y plane as shown in FIG. 1D).

The alignment of the sensor chip 130 and the current conductor 120 is crucial because the magnetic field sensors 132, 134 have to be positioned precisely with respect to the current conductor and eventually with respect to the lateral notches within the patterned current conductor. The smaller, or the more pointed the ends of the slots in the current conductor according to FIG. 1B are the more magnetic field will be concentrated near these ends. In other words, the smaller the reduced cross-section 129 and the shorter the length of the reduced cross-section in flow direction is, the higher the magnetic field and the higher the concentration of a magnetic field near the ends of the notches. Therefore, to obtain an optimum measurement sensitivity, it is vital to locate the magnetic field sensors 132, 134 exactly at these ends of the notches, as shown in FIG. 1B. However, with regard to the production, the precise alignment is difficult as the opaque printed circuit board is arranged between the current conductor and the sensor chip. Embodiments of the method for producing the sensor package, therefore, are adapted to include making visual marks on the top side 110b of the printed circuit board which help, for example an automated die-bonder to find its place and to arrange the sensor chip and the respective magnetic field sensors precisely above these notch ends. The use of printed circuit boards as mechanical carriers for the sensor package production can benefit here from the experience of printed circuit board manufacturers with regard to the manufacturing of multi-layer printed circuit boards with ultra-fine conductor traces where the alignment of various layers of the printed circuit board is crucial for a correct interconnection of the printed circuit board layers, e.g. through conductive vias.

Printed circuit board based sensor packages are also beneficial with regard to the production of finely patterned magnetic field producing regions 126 of the current conductor 120, which generates the magnetic field. Certain embodiments of the sensor package comprise a structure current conductor 120 with notches or slots 128 having, for example, radii of curvature of 50 μm to 200 μm. For example, in case the vertical dimension of the current conductor he is about 100 μm, the radius of curvature at the end of the notch is about 50 μm. In case the current conductor 120 has a vertical dimension he of about 400 μm, the radius of curvature is about 100 μm to 200 μm. Again, for the production of such structured magnetic field producing regions 126 one can make use of the existing know-how of printed circuit board manufacturers to manufacture such conductive layers 120, 126 with sufficient accuracy, for example via mechanical or chemical processes like milling or etching.

Figure 5:
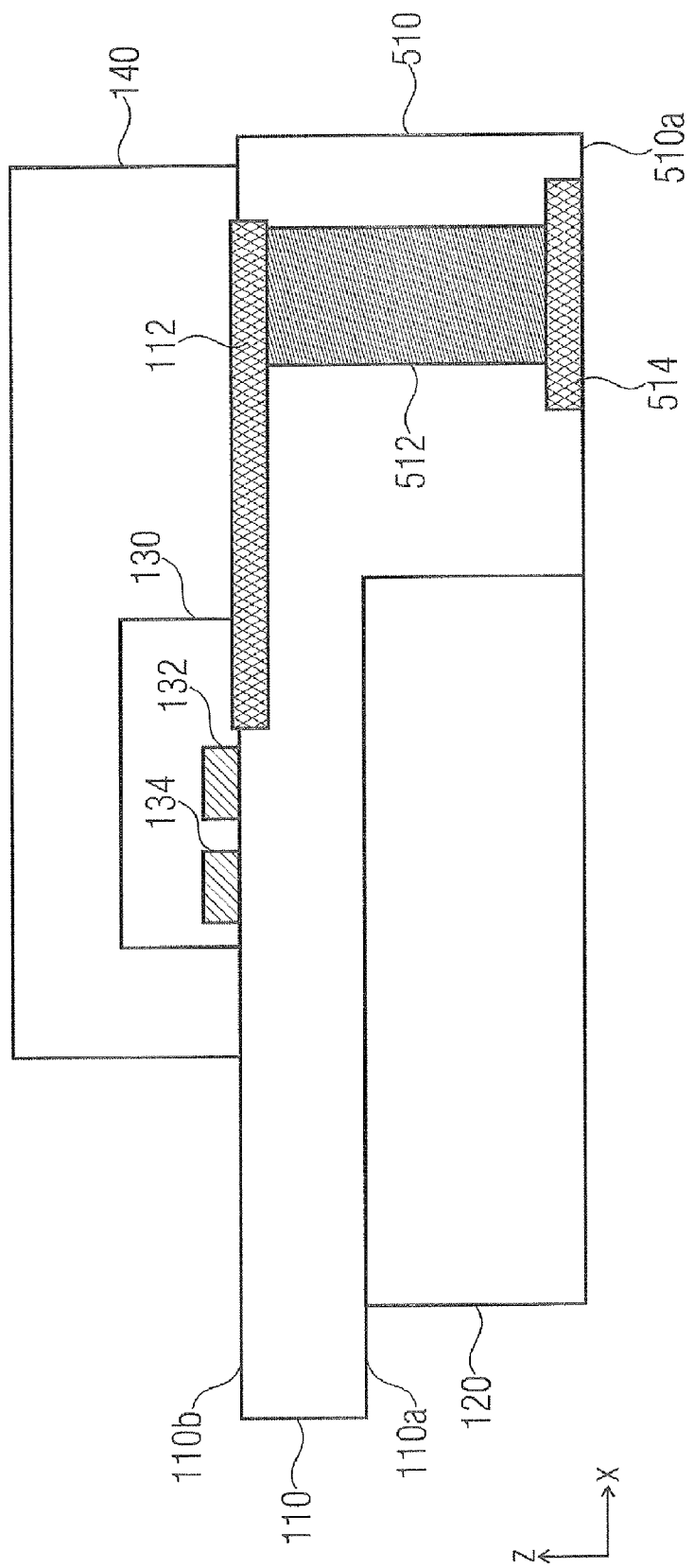
FIG. 5 shows a schematic cross-sectional view of an embodiment according to FIG. 1A with a via through the printed circuit board to connect the sensor chip on the same side as the current conductor.

Embodiments of the sensor package may further be adapted such that all contacts, the high current contacts for the current conductor and the small sense contacts and power supply contacts for the sensor chip, are available on the same surface or side of the package as shown in FIG. 5. FIG. 5 shows a schematic cross-sectional view of a sensor package comprising a printed circuit board 110 with a protruding part 510 protruding in vertical direction (z-axis). The protruding portion 510 protrudes in direction of the current conductor 120, or in other words, protrudes away from the sensor chip 130 and has, for example, the same vertical dimension as the current conductor 120. The conductive traces 112 connecting the sensor chip 130 are connected through conductive vias 512 arranged vertically in the printed circuit board 110 and the protruding portion 510 to the sense contacts 514 arranged on the first main surface 510a. The surface of the sense or sensor contacts 514 are arranged flush with the surface of the current conductor facing away from the printed circuit board.

The sensor chip 130 in FIG. 5 is arranged face-down, or in other words via a flip-chip mounting, on the second main surface 110b of the printed circuit board and is connected via contacts (not shown) arranged on the first main surface 130a of the sensor chip to conductive traces 112.

Figure 6A:
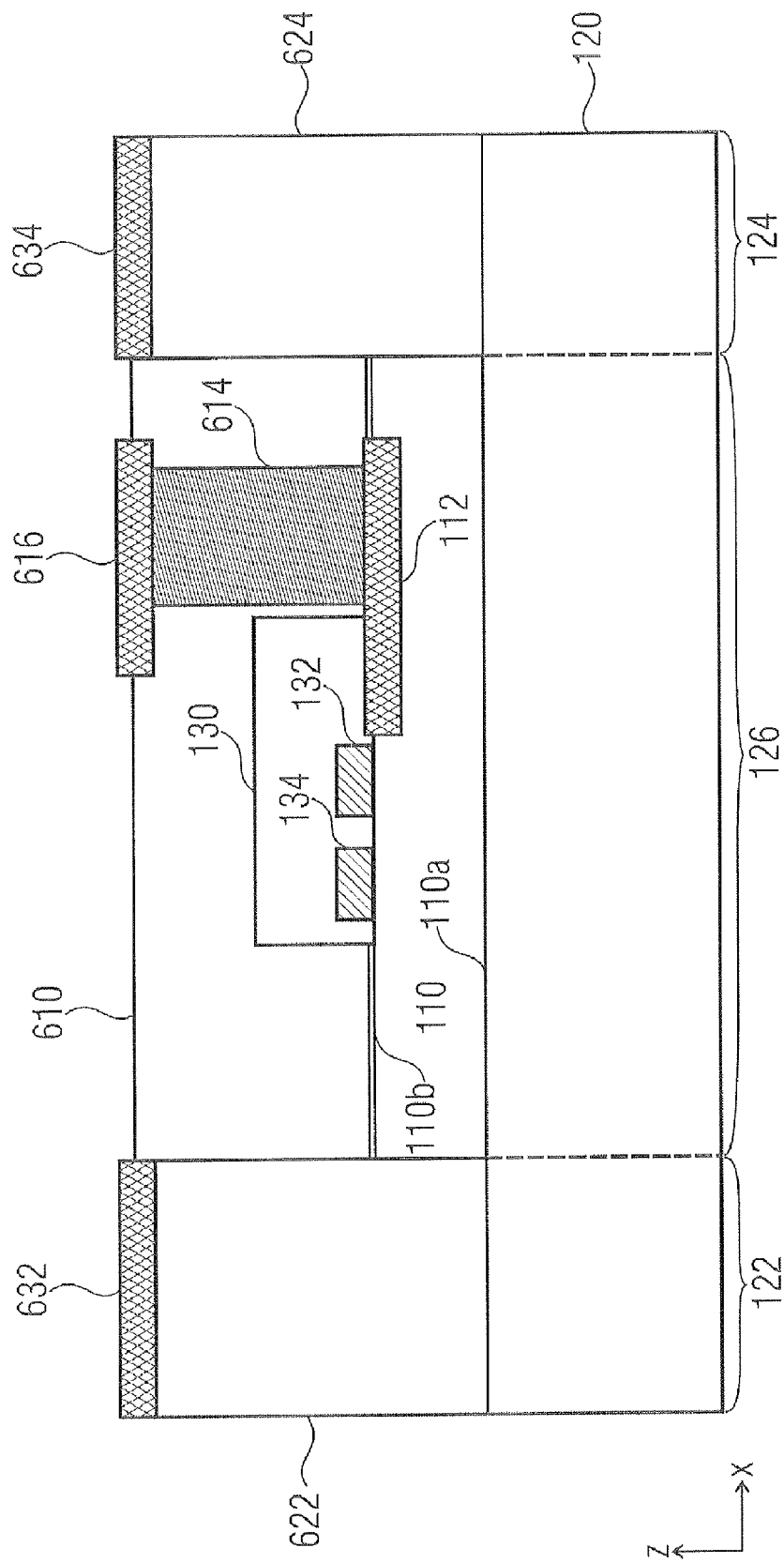
FIGS. 6A-6C show schematic cross-sectional views and a top-view of alternative embodiments of the sensor package for connecting the sensor chip and the current conductor on the same side.
Figure 6B:
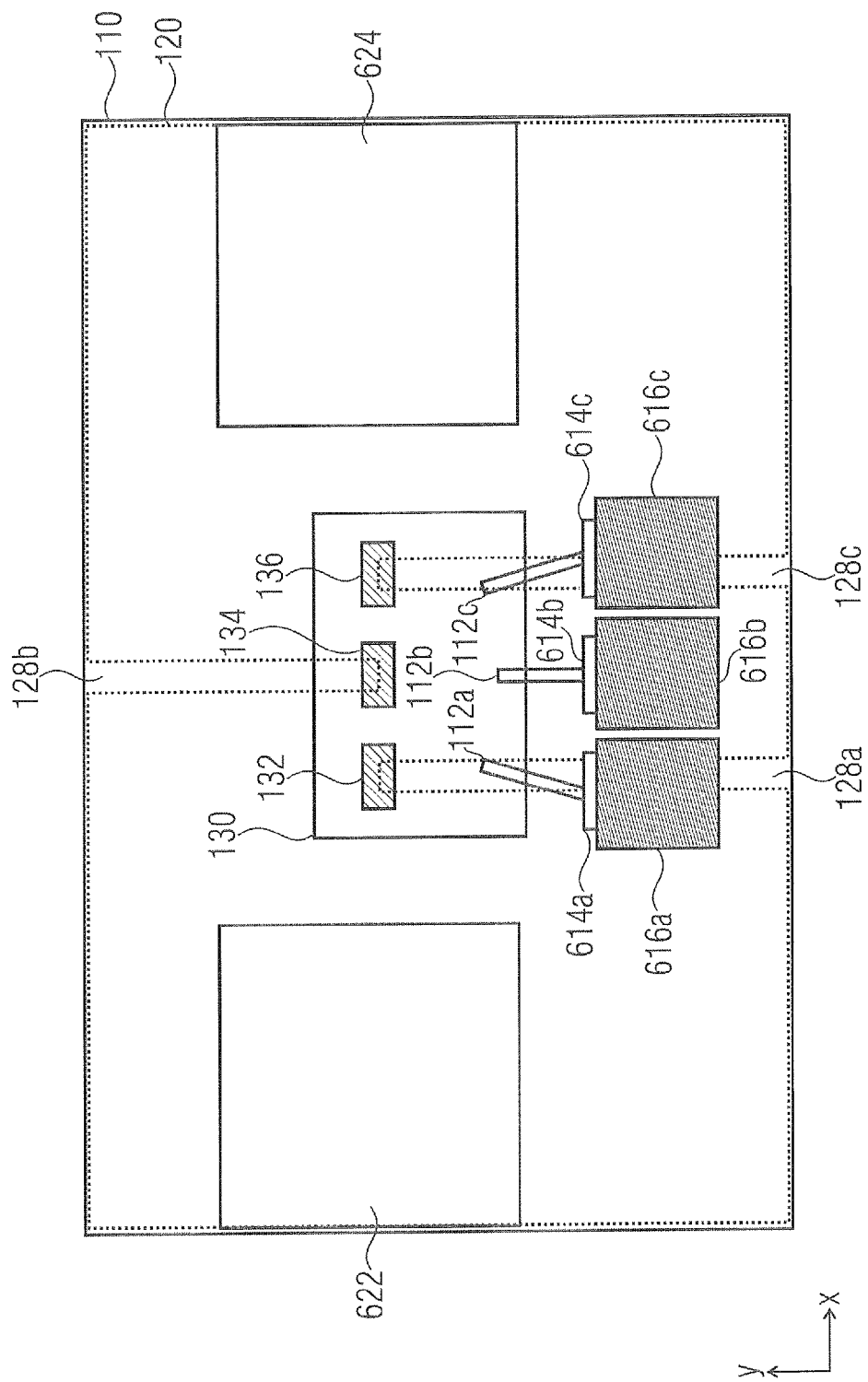

An alternative embodiment is described based on FIGS. 6A and 6B, wherein FIG. 6A shows a schematic cross-section view of the embodiment and wherein FIG. 6B shows a schematic top-view of the embodiment. FIG. 6B shows a top-view of the embodiment according to FIG. 6A with the additional printed circuit board layer 610 removed to give sight to the sensor chip. In this alternative embodiment the massive contacts for the primary current to be measured can be brought up to the top surface (orientation according to FIG. 6A) of the sensor package and the sensor package can be used, for example, upside down. The sensor chip in FIG. 6A is flip-chip mounted, or in other words, is mounted face-down, on the printed circuit board 110. Two magnetic field sensors 132, 134 and the electrical contacts for connecting the sensor chip 130 are arranged on the first main surface 130*a* of the sensor chip facing towards the printed circuit board 110. The electrical contacts of the sensor chip are connected to conductive traces 112 arranged on the second main surface of the printed circuit board. A further or upper printed circuit board layer 610, for example similar to the embodiment described based on FIG. 1C, is arranged on the printed circuit board 110 and the sensor chip 130 and completely seals and surrounds the sensor chip 130. Within the additional printed circuit board layer 610, a vertical electrically conducting via 614 is arranged and connects the conductive traces 112 to the sensor contacts 616 arranged on the main surface of the additional printed circuit board layer 610 facing away from the printed circuit board 110.

FIG. 6B shows the sensor chip 113 with three magnetic field sensors 132, 134, 136, for example three Hall plates arranged lateral to each other, wherein the sensor chip 130 is connected via three fine conductive traces 112*a*, 112*b* and 112*c*, arranged on the second main surface of the printed circuit board 110 to respective three vias 614*a*, 614*b* and 614*c*, which are again connected to three sensor contacts 616*a*, 616*b* and 616*c*. FIG. 6B additionally shows the massive contacts for the primary current contact 614 connected via the vertical via 622 to the first contact region 122 and a second primary current contact 634 connected via a second massive conductive via 624 arranged in an additional printed circuit board layer 610 and eventually also in the printed circuit board 110, to the second contact region 124 of the current conductor. Further embodiments may comprise instead of a single massive via a large number of smaller vias electrically connected in parallel and geometrically arranged in a matrix form.

The dotted line in FIG. 6B shows the edge or circumference of the conductive layer or current conductor 120. The current conductor 120 comprises three slots 128*a*, 128*b* and 128*c* arranged on opposite sides of the current conductor with regard to the current flow direction to define a "W" current flow. A plain view of one of the printed circuit board layers 110, 610 or of both printed circuit board layers may have a shape of an "H" (see FIG. 6B) in order to give a passage for the current to be measured.

Figure 6C:
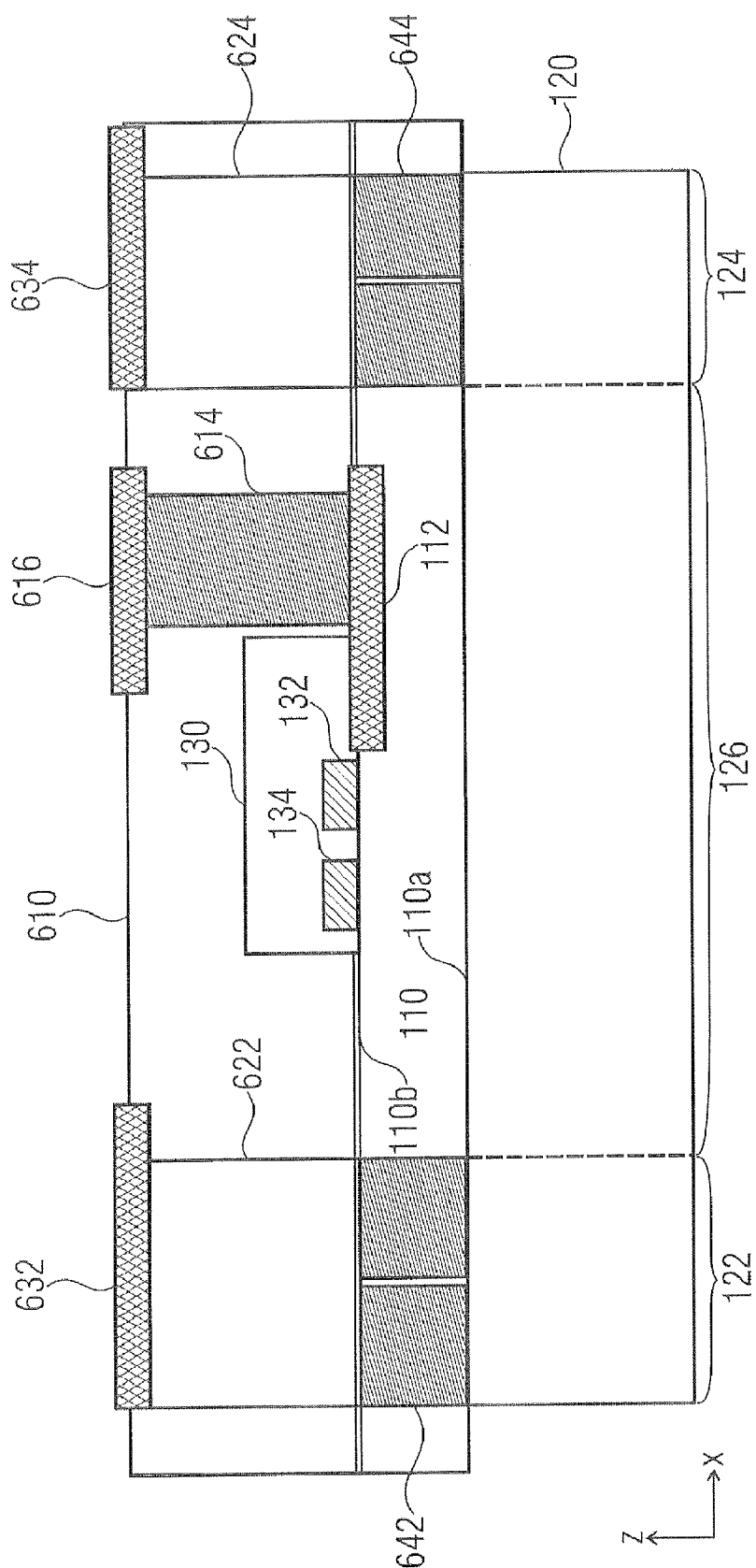

FIG. 6C shows an alternative embodiment to FIG. 6A, wherein the contacts 632, 634 for the current to be measured can be part of the additional printed circuit board layer 610 and are coupled to the lower conducting layer 120 by numerous vias 642 and 644 to pass the high current through.

Figure 7A:
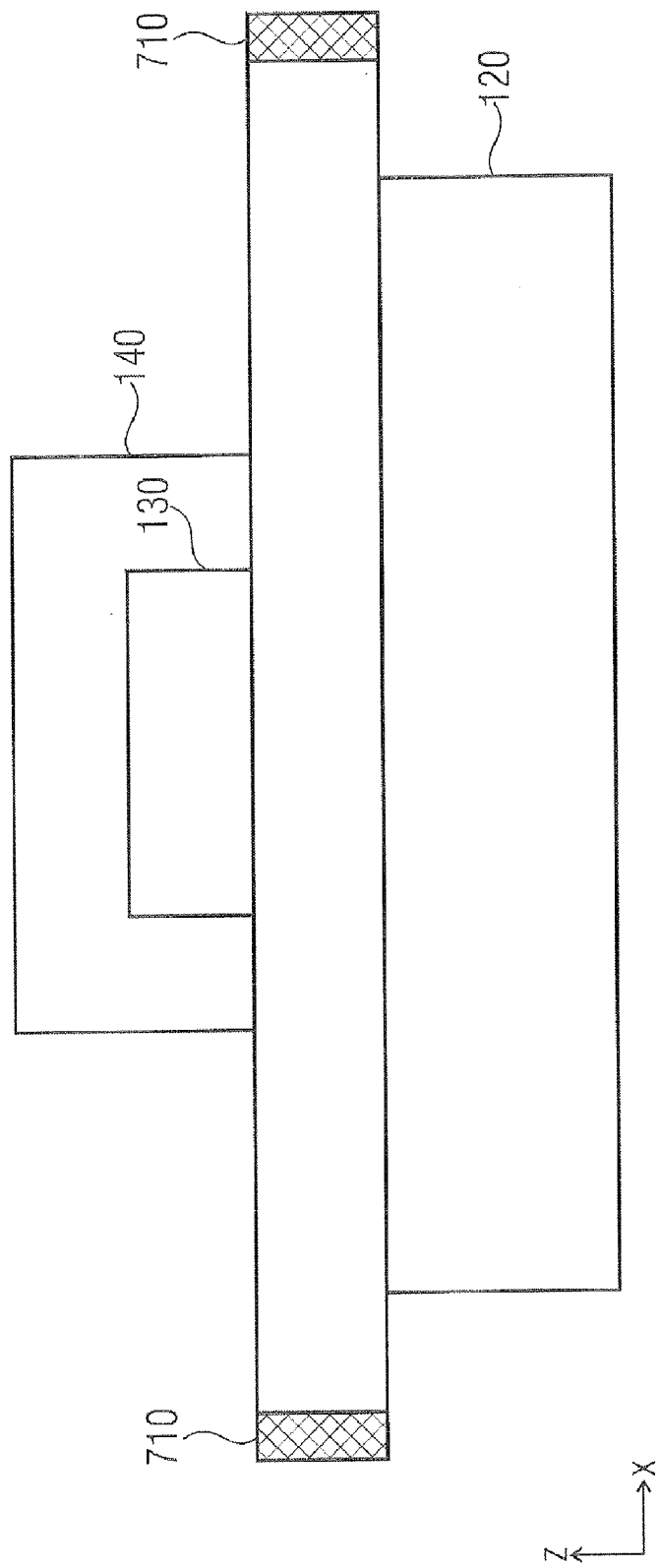
FIGS. 7A and 7B show schematic cross-sectional views of embodiments of the sensor package similar to FIG. 1A with enhanced protection against lateral ingress of moisture into the printed circuit board package.
Figure 7B:
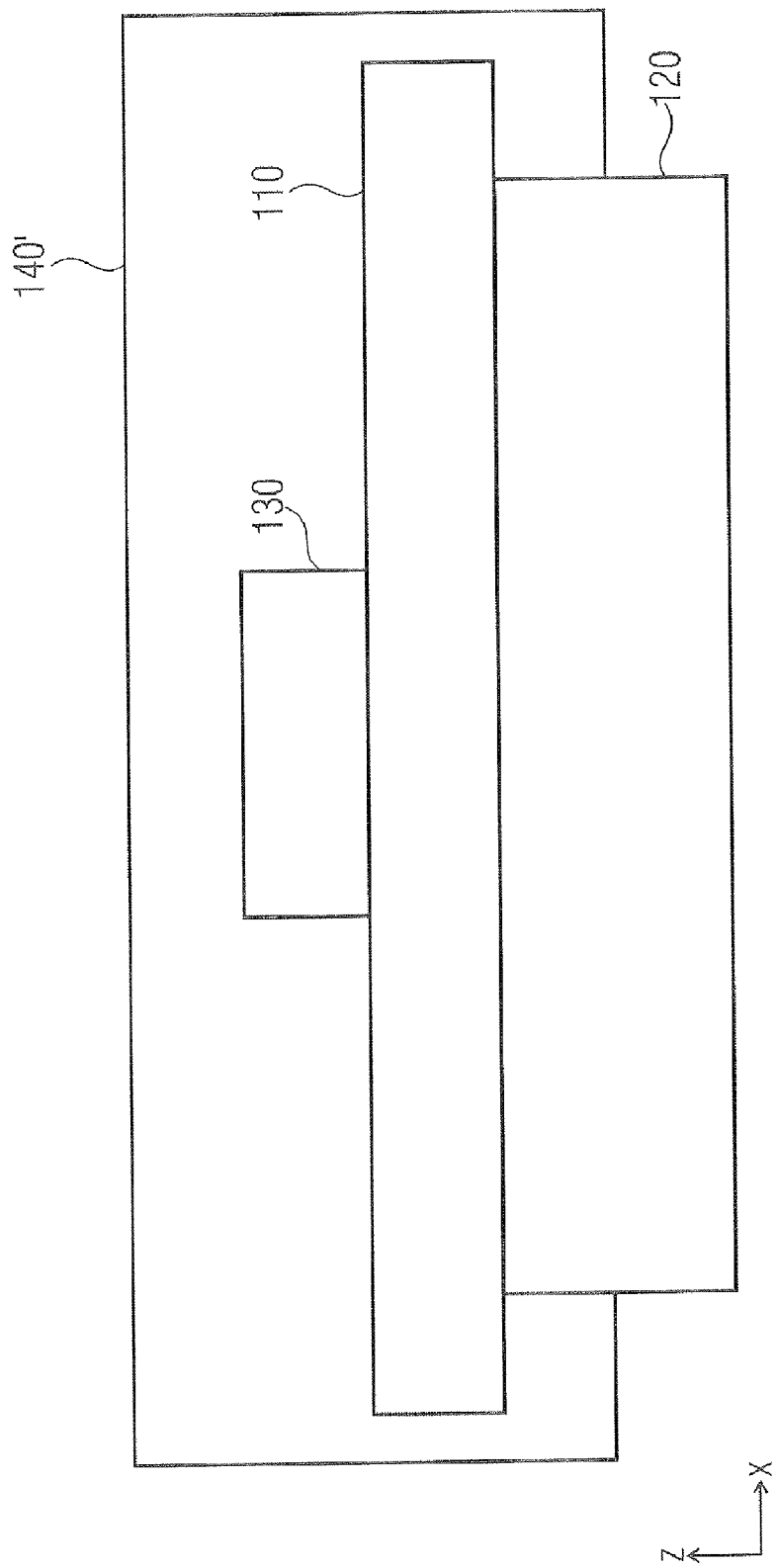

Environmental conditions may cause problems with regard to the sensor chip and its correct vertical and lateral positioning with regard to the current conductor 120, but may also affect other parts of the sensor chip. For example, lateral ingress of moisture into the printed circuit board 110 may cause major problems because the moisture may destroy the laminar structure of the printed circuit board or it may lead to dwelling of the printed circuit board thickness (e.g. its vertical dimension hp), which would cause a drift in the reading of the current, similar to the bending of the sensor chip alone. This is all the more severe as the sensor package is much smaller than ordinary printed circuit boards which hold and connect numerous devices and have e.g. 100 times longer migration paths for moisture compared to embodiments of the sensor package. Therefore, embodiments of the present invention comprise some isolation barrier against the moisture soaking of the printed circuit board. Such barriers can be, for example, a ring of wires, by coating the flush surfaces of the printed circuit board 110 with moisture-resistant varnish or grease 710 as shown in FIG. 7A, or by over-molding the entire printed circuit board as shown in FIG. 7B. FIG. 7B shows the mold body 140' not only hermetically sealing the sensor 130, but also the printed circuit board 110 from the environment. It is also possible to wrap up the printed circuit board with a moisture resistant foil or to cover its top surface with a foil, which overlaps the side walls, when it is wrapped around them. The foil can be fixed to the printed circuit board by adhesives.

It is possible to integrate further electronic components into embodiments of the printed circuit board package. In particular, it is favorable to connect a ceramic capacitor between supply pins of the sensor circuit 130, especially if the sensor circuit 130 is an active integrated circuit with a large digital part on it, which draws large currents at each clocking event. Since the rise time of the clocks is well below 10 ns, the tank capacitor needed to stabilize the supply needs to be as close as possible to the integrated circuit 130, otherwise it would be ineffective due to large series inductance caused by the long leads. On the other hand, most capacitors use at least partial magnetic materials. Thus, these capacitors would interfere with the magnetic field of the primary current to be measured and cause a measurement error. Therefore, moving the responsibility of selecting this sensitive device (the tank capacitor) and of trimming the entire sensor chip 130 after the package has been fully assembled to the semiconductor manufacturer allows to account for residual magnetism of the capacitor, to perform a calibration sequence of the whole current sensor and to provide a high sensitivity and accuracy current sensor by the manufacturer. Users of the sensor package do not have to deal with such aspects and the design-in of such sensor packages is facilitated.

Figure 8:
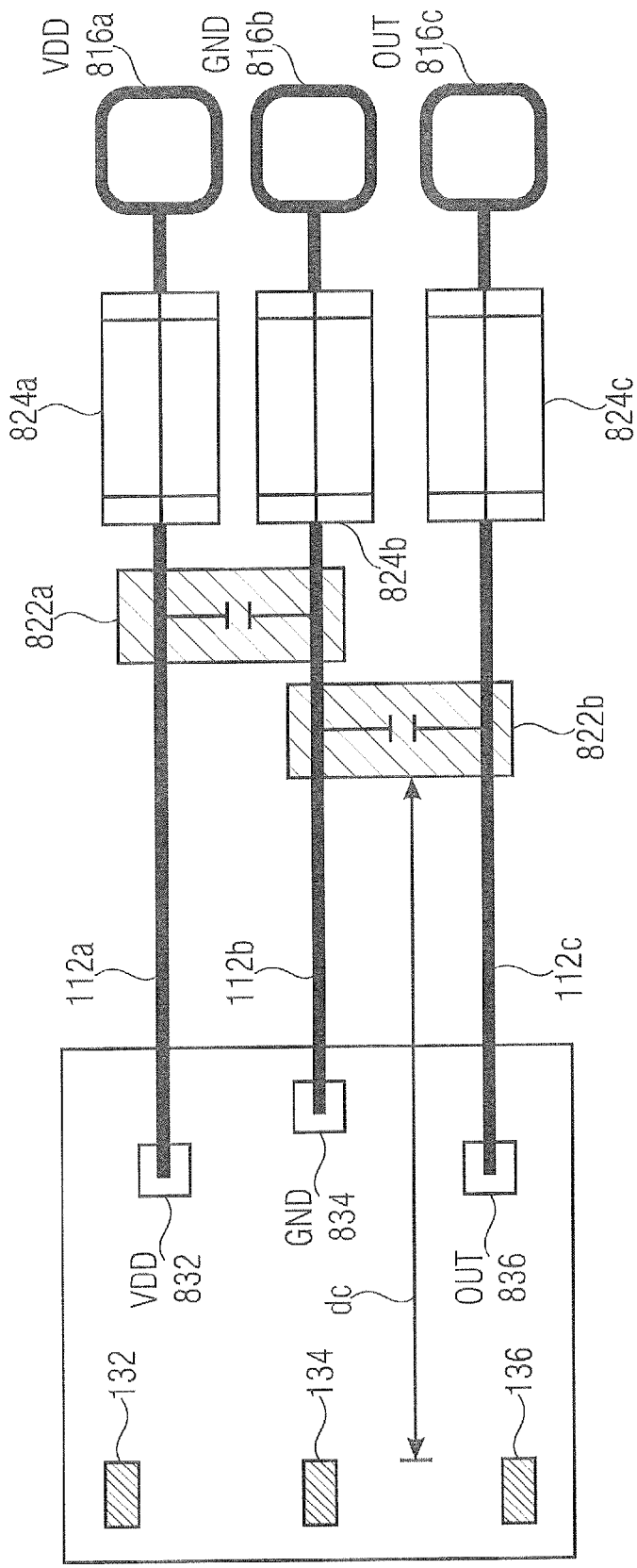
FIG. 8 shows a layout of an electrical connection of the sensor chip to the sensor contact pads.

Further embodiments of the sensor package comprise especially thin wires 112 to contact the sensor chip 130. Thus, in case of an accidental short-circuit between the primary current circuit and the semiconductor sensor, for example, due to malfunctioning of the insulating printed circuit board-layer 110 between the two, the thin wires 112 act as fuses and blow before transferring a lethal amount of charge to the pins of the sensor chip 130. Again, the use of a printed circuit board as a carrier for the sensor package is beneficial as it allows to produce fine long traces 112 on the second main surface of the printed circuit board to contact the sensor chip 130. Moreover, it is possible to connect a passive device such as a protection resistor or diode or a discrete fuse device into the supply and signal lines of the semiconductor die 130. An embodiment of the sensor package comprising some of the aforementioned features is shown in FIG. 8. FIG. 8 shows a layout of sensor chip 130 and its connection to connecting pads of the sensor package. FIG. 8 shows the sensor package comprising three magnetic field sensors 132, 134 and 136 and three contact pads 832, 834 and 836, wherein the contact pad 836 forms the out-pad (OUT) of the sensor package for outputting the measured current value, contact pad 834 (GND) forms the ground pad of the sensor package and contact pad 832 forms the voltage supply pad (VDD) for supplying power to the sensor chip 130. The out-pad 836 is connected via a fast fuse 824C to a contact pad 816*c* (OUT) of the sensor package. Ground pad 834 is connected via a conductive trace 112*b* and a second fast fuse 824*b* arranged in series to a connecting line 112*b* to a ground pad 816*b* (GND) of the sensor package. Power supply pad 832 is connected via a third conductive trace 112*a* and a third fast fuse 824*a* to a power supply pad

816a (VDD) of the sensor package. The fast fuses 824a,b,c blow in case of over-current, i.e. in case the current exceeds a certain threshold current. In particular embodiments of the sensor package all pins 832, 834 and 836 are protected by fuses or thin conductor traces, which act like fuses, to provide a save protection of the sense pins VDD, GND and OUT or 832, 834 and 836. In addition, a first voltage stabilizing capacitor 822a is connected between the conductive traces 112a and 112b and a second voltage stabilizing capacitor 822b is connected between the conductive traces 812c and 812b. In other words, the sensor chip 130 is connected via ample conductive traces 112a, 112b and 112c to a capacitor and a series fuse in each line, whereby the distance dc of the capacitor and the fuses to the sensor chip 130 is large enough to guarantee no magnetic interference onto the sensor operation. The conductive traces or bond wires are thick enough to have sufficiently small resistance and inductance. Other embodiments of the sensor package may comprise, besides the sensor chip, one or several discrete circuit elements, e.g. discrete circuit elements not integrated into the sensor chip, coupled between a pin or a contact of the sensor chips, for example, 832, 834 and 836, and an external contact or contact pad of the sensor package, for example, 816a, 816b and 816c. Typically such discrete circuit elements comprise lead frames and/or contacts with nickel (Ni) plating or other materials which are magnetic. To reduce disturbances of the measurement of the magnetic field of the current by magnetic fields caused by these discrete circuit elements or by magnetic materials used in their construction, one or all of these discrete circuit elements of embodiments of the sensor package comprise only material with a relative permeability of less than 1.1 or in case the discrete circuit elements comprise material with a relative permeability of 1.1 or more than 1.1 the discrete circuit elements are arranged spaced apart from the magnetic field sensor by at least 1.5 mm. In even further embodiments, the sensor package 100 does not comprise any discrete circuit elements with a relative permeability of more than 1.1 that is arranged in a distance smaller than 1.5 mm to any magnetic field sensor element of the sensor chip. The discrete circuit elements described above comprise, for example, capacitors, fuses and/or electrical conductors including the conductive traces 112 laminated on the printed circuit board.

Common printed circuit board materials can establish a voltage insulation of 4 kV at thicknesses or vertical dimensions (z-axis) of 150 μm. If, for example, even higher voltage insulation of up to 12 kV is needed, additional insulation layers like polyimide layers, for example comprising or made of Kapton, can be arranged between the printed circuit board 110 and the sensor chip 113. FIG. 9A shows an embodiment of a sensor package with a printed circuit board 110 comprising a cavity on a second surface 110b, in which the sensor chip 130 is arranged and, wherein between the sensor chip and the printed circuit board 110 an additional insulation layer 910 is arranged to increase the voltage insulation or dielectric strength. In contrast to the embodiment according to FIG. 2, the cavity has larger lateral and vertical dimensions than the sensor chip 130 and also a vertical dimension larger than a combined vertical dimension of the sensor chip 130 and the additional insulating layer 910, so that the mold material 140 is used to completely fill the cavity and to thus seal the sensor chip 130 from the environment. As can be seen from FIG. 9A, the main surface of the mold body 140 facing away from the current conductor has the same height level as the printed circuit board 110. For such embodiments the contacts to the sensor chip 130 can be made via thin traces of copper on the top surface of the additional insulating layer, for example a Kapton tape, if the sensor chip is mounted upside-down or via simple bond wires if the sensor chip 130 is mounted face-up.

Whereas FIG. 9A shows a schematic cross-sectional view of an embodiment of the sensor package with a flip-chip mounted sensor chip and an additional insulation layer between the sensor chip and the printed circuit board, FIG. 9B shows a schematic cross-sectional view of an alternative embodiment of the sensor package with a face-up mounted sensor chip and an additional insulation layer between the sensor chip and the printed circuit board. The term he refers to the vertical dimension of the magnetic field producing region vertical to the first main surface 110a of the printed circuit board 110, hp refers to the vertical dimension of the region 110i of the printed circuit board 110 arranged between the sensor chip 130 and the magnetic field producing region 126 of the current conductor 120 (see also FIG. 10 or 2), hi refers to the vertical dimension of the insulating layer or the region of the insulating layer arranged between the sensor chip 130 and the magnetic field producing region 126, and hd refers to the vertical distance between one or all magnetic field sensors associated to the current conductor and comprised in the sensor chip and the surface 110a of the current conductor facing towards the sensor chip or magnetic field sensor 132. As can be seen from FIG. 9A (top down mounting of the sensor chip), the vertical distance hd roughly corresponds (in case the magnetic field sensor is arranged near or at the surface 130a of the sensor chip facing towards the current conductor) to the vertical dimension of the printed circuit board hp (in case no other layers are arranged between the sensor chip and the current conductor, or to the total of the individual vertical dimensions, e.g. hi+hp, in case one or more insulating or dielectric layers are between the sensor chip and the current conductor. In case of face-up mounted sensor packages or sensor packages, wherein the magnetic field sensor is arranged near or at the surface 130b of the sensor chip facing away from the current conductor (see FIG. 9B), the distance of the magnetic field sensor to the surface 130a of the sensor chip is also included in the vertical distance hd.

Figure 10:
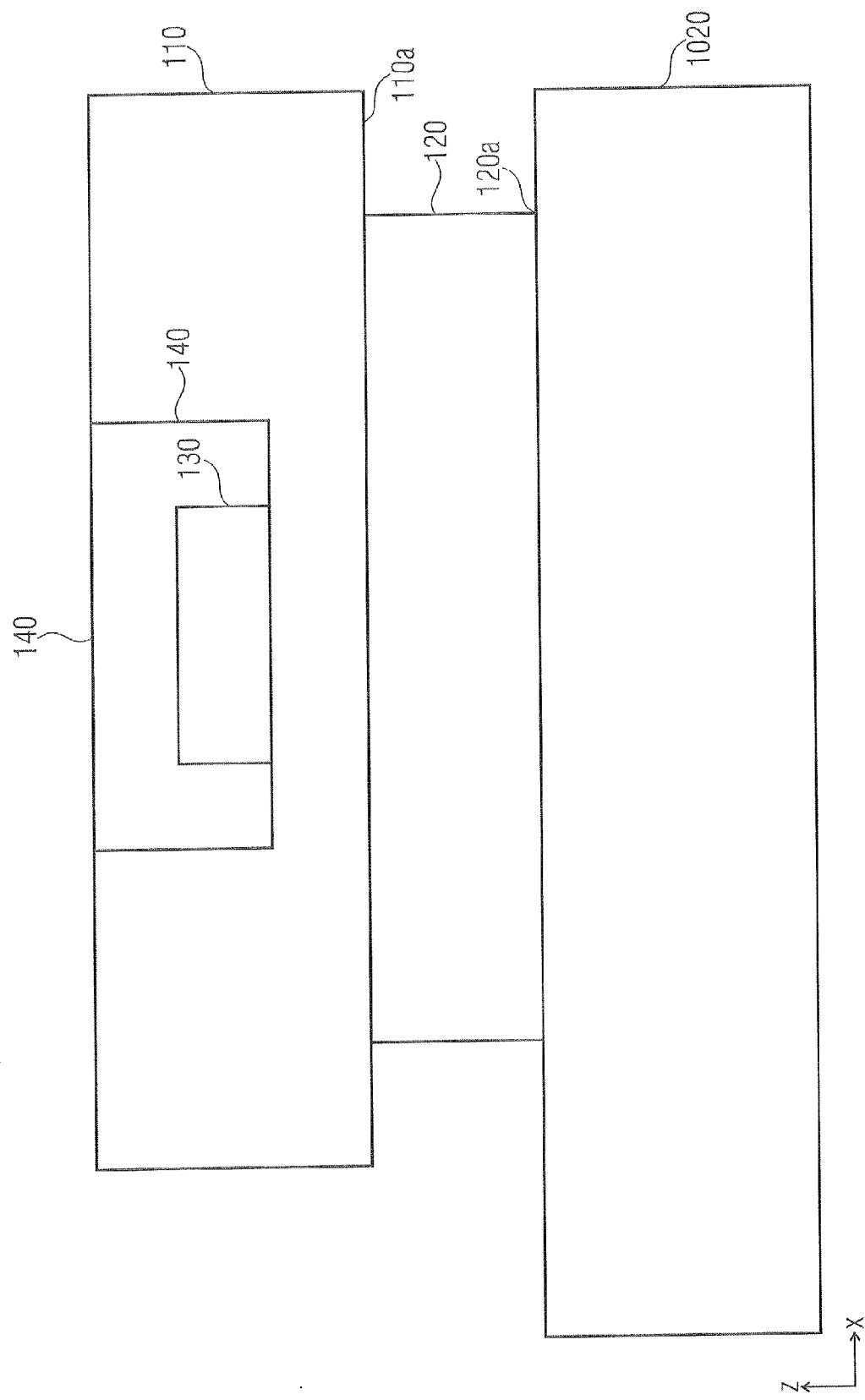
FIG. 10 shows a schematic cross-sectional view of an embodiment of the sensor package with an additional conducting layer arranged below the conductive layer.

It is possible to add another conductor at the bottom of the package, for example, by arranging the current conductor 120 onto this additional conductor. FIG. 10 shows a schematic cross-sectional view of an embodiment of the sensor package with an additional current conductor 1020 arranged on the main surface 120a facing away from the sensor chip 130. The vertical dimension of this additional current conductor 1020 is larger than the vertical dimension of the current conductor 120. Thus, a series resistance of the additional current conductor 1020 is smaller than a series resistance of the current conductor 120. This keeps the dissipation low and allows to reduce the dissipation considerably while keeping the magnetic field produced by the magnetic field producing region 126 still high. In certain embodiments the vertical dimension of the additional conductor layer is 2 times larger than the vertical dimension he of the current conductor, or 5 times larger. The layer 1020 can be a coarsely patterned thick conducting layer 120 and the layer 120 a finely patterned thin conducing layer.

Figure 11:
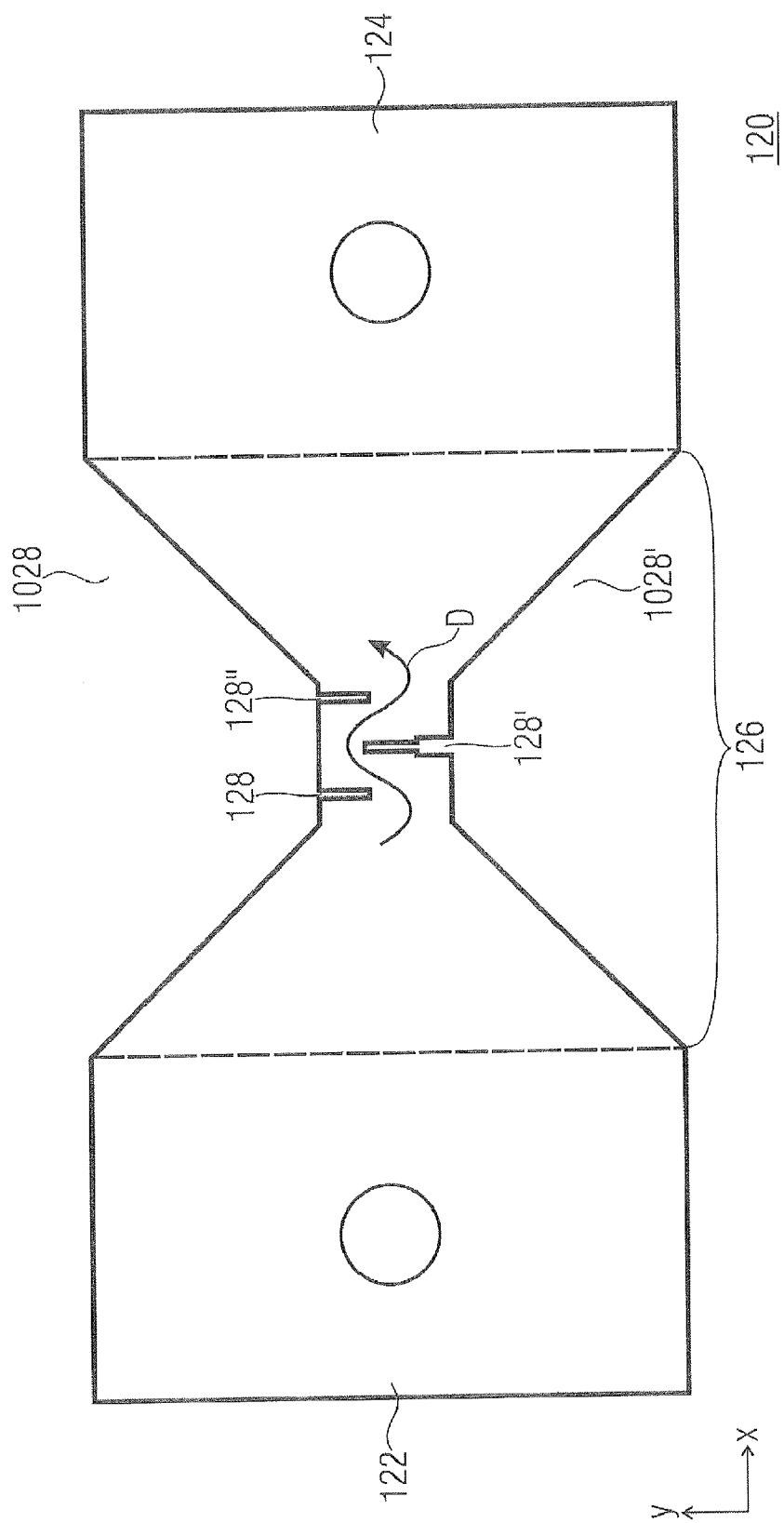
FIG. 11 shows a schematic top-view of a further embodiment of the current conductor with three slots.

FIG. 11 shows a further embodiment of the current conductor 120, wherein the magnetic field producing region 126 comprises two notches 1028 and 1028' arranged opposite to each other with regard to the current flow direction such that the two notches 1028 and 1028' define a central reduced cross-section, wherein additionally three slits 128, 128' and 128" are arranged on opposite sides of the reduced cross-section to bend the current flow according to a "W"-shape (see arrow D). The reduced cross-section and the additional bending of the current by the slots increases the magnetic field at the slots and provides basis for a high sensitivity current measurement by magnetic field sensors arranged above the ends of the slots 128, 128', 128". The two slots 128 and 128' reach from the top downwards (with regard to the orientation of FIG. 11) and the central slot 128' reaches from the bottom up (with regard to the orientation of FIG. 11).

Figure 12:
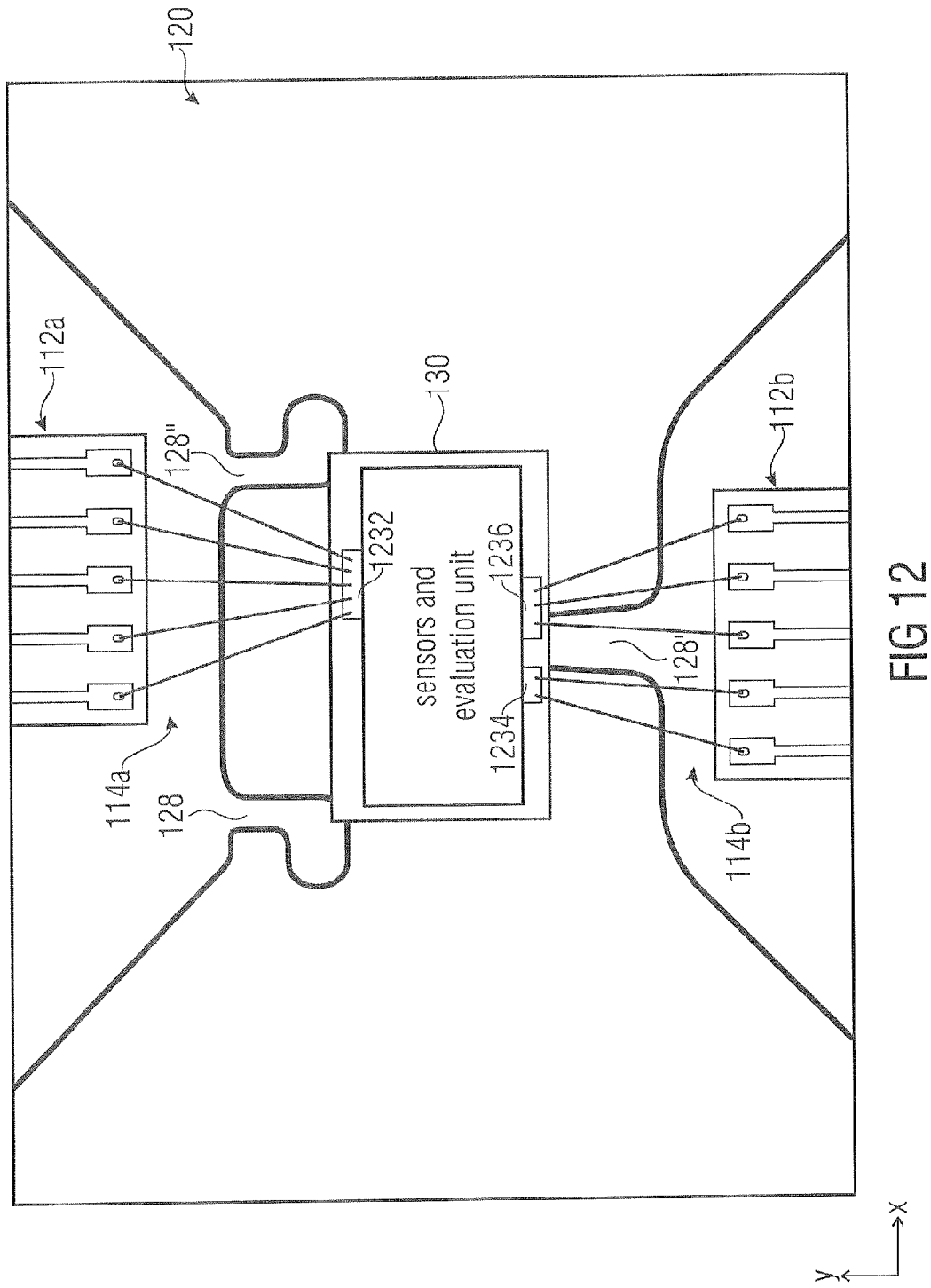
FIG. 12 shows a schematic top-view of a prototype of an embodiment of the sensor package.

FIG. 12 shows a schematic top-view of a sensor package with a current conductor similar to the one shown in FIG. 11 (with three slots, two on one side and the central slot on the opposite side with regard to the flow direction). FIG. 12 shows the three slots 128, 128' and 128", the sensor chip 130 with contact pads 1232, 1234 and 1236, wherein the contact pads 1232 of the sensor chip 130 are connected via bond wires 114*a* to conductive traces 112*a* and the contact pads 1234 and 1236 of the sensor chip 130 are connected by bond wires 114*b* to conductive traces 112*b*. For demonstration purposes only one transparent varnish was used as insulation layer between the current conductor and the sensor chip 130.

Figure 13:
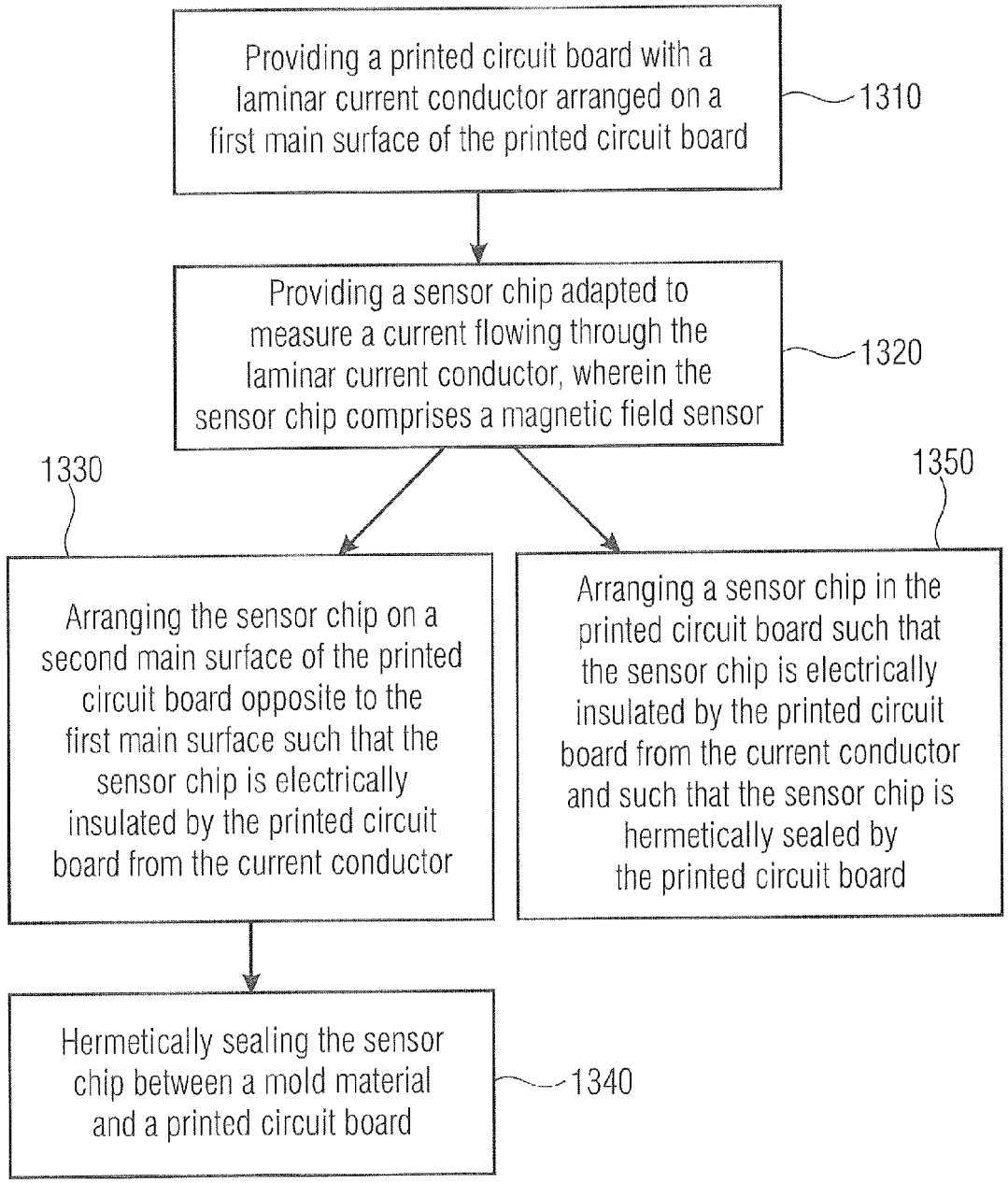
FIG. 13 shows a flow-chart of an embodiment of a method for producing an embodiment of the sensor package.

FIG. 13 shows a flow chart of a method for producing a sensor package. The method for producing a sensor package comprises, providing 1310 a printed circuit board with a laminar current conductor arranged on a first main surface of the printed circuit board, and providing 1320 a sensor chip adapted to measure a current flowing through the laminar current conductor, wherein the sensor chip comprises a magnetic field sensor. According to a first embodiment, the method further comprises arranging 1330 the sensor chip on a second main surface of the printed circuit board opposite to the first main surface such that the sensor chip is electrically insulated by the printed circuit board from the current conductor, and hermetically sealing 1340 the sensor chip between a mold material and a printed circuit board.

According to a second alternative embodiment of the method, the method comprises arranging 1350 a sensor chip in the printed circuit board such that the sensor chip is electrically insulated by the printed circuit board from the current conductor and such that the sensor chip is hermetically sealed.

Further embodiments of the method comprise arranging the sensor chip on the second main surface of the printed circuit board using alignment structures or alignment marks arranged on the second main surface.

Even further embodiments comprise producing the sensor chip in a printed circuit board panel comprising a plurality of sensor chips, wherein one or all of the steps of producing and testing are performed with the sensor chip arranged in the printed circuit board panel. In addition, the sensor package can be isolated from the printed circuit board panel after an end-of-line test, wherein the sensor chip is tested individually (in parallel or in series) from other sensor chips of the printed circuit board panel.

Further embodiments of the method comprise calibrating the sensor package, e.g. before isolating the sensor chip from the circuit board panel. The calibration comprises applying a current of a known intensity to the current conductor, measuring the current or obtaining the signal of the magnetic field sensor or the sensor chip associated to the current, comparing the known intensity of the current with the measured intensity of the current and determining a deviation between the known intensity of the current and the measured intensity of the current and applying a correction of the measured value to reduce the deviation so that after the calibration the evaluation unit outputs the correct current intensity value. The correction can be performed by the evaluation unit, e.g. by mapping the signal provided by the magnetic field sensor and/or mapping a value obtained based on this value to an output value provided in a mapping table (calibration table) or calculated based on a mapping function (calibration function).

In certain embodiments the calibration is performed after the complete sensor chip has been packaged, e.g. after the sensor chip and any other optional discrete circuit element has been sealed by the printed circuit board and/or the sealing material, and only the external contacts or pads, e.g. 816*a*, 816*b*, 816*c*, of the sensor package remain for electrically connecting the sensor chip. Thus, any production variation, e.g. with regard to the electrical characteristics of the sensor chip, the one or more magnetic field sensors comprised in the sensor chip and the individual discrete circuit elements and/or any production variation, e.g. with regard to assembling and structuring variations like the position, structure and dimensions of the current conductor and the relative position of the magnetic field sensors with regard to the current conductor and the optional notches or slits, can be corrected using calibration information stored in the sensor chip or sensor package to obtain a reliable and high accuracy current sensor package at low cost.

The printed circuit board packages have a lower thermal mass than lead frame packages and, thus, smaller thermal settling times and shorter calibration times, in particular, when calibrating the sensor package at different temperatures. Thus, the production of PCB current sensor packages, as described above, have lower production costs compared to conventional lead frame based current sensor packages.

Further embodiments of the sensor package can comprise a housing or package for an integrated circuit 130 with one or several magnetic field sensor elements 132, which measures the electric current flowing through the current conductor 120 by measuring the magnetic field coupled to the current. These packages 100 comprise a current conductor 120, a printed circuit board or printed circuit board intermediate layer 110 and an integrated semiconductor chip 130 hermetically sealed by the printed circuit board or by the printed circuit board and molding material.

Further developments of such embodiments may comprise a current conductor 120 with a laminar shape, i.e. the lateral dimensions of the current conductor in both extension directions (x and y axis) are considerably larger than the vertical dimension (z-axis) of the current conductor.

In further developments of such embodiments the current conductor may comprise two contact regions 122, 124 and a magnetic field producing middle area 126 arranged in-between the two contact regions, wherein each of the contact regions and also the magnetic field producing region 126 comprises a larger area (extension with regard to the lateral dimensions) than the semiconductor chip 130, and/or wherein the magnetic field producing region 126 has a vertical dimension (z-axis) larger than the printed circuit board intermediate layer 110.

In further developments of such embodiments the printed circuit board intermediate layer 110 can be arranged such that a dielectric strength of at least 1000 V is accomplished and/or the printed circuit board intermediate layer 110 can be adapted to have no magnetic components and no conducting areas for large circular eddy currents, for example, eddy currents with a diameter of more than 1 mm.

In further developments of such embodiments the printed circuit board forms a means to mechanically support and electrically connect electronic components via conductive traces, for example, etched from copper sheets laminated onto a non-conductive board comprising an insulating or dielectric composite material. The composite materials used for circuit board production are, for example, made up of two or more different materials which remain separate and distinct on a microscopic level within the finished structure. Typically two categories of materials of producing composite material are distinguished, matrix material and reinforcement material, wherein the enforcement material reinforces the matrix material to provide the rigid composite material or composite structure. Matrix materials are often polymeric materials, also referred to as resin solutions, whereas for reinforcement materials often fibers, but also woven sheets of paper are used. Well-known composite materials used for printed circuit boards are, for example, FR-2 (phenolic cotton paper) FR-3 (cotton paper and epoxy), FR-4 (woven glass and epoxy), FR-5 (woven glass and epoxy), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester). In particular the FR composites are commonly used due to their flame-retardness (FR-flame retardant).

Typically, a layer of copper is coated or laminated over the entire substrate, on one side or on both sides. To produce the wanted conductive traces or conductors, e.g. the conductive carrier 120 or the conductive traces 112, the unwanted core parts are removed. Besides these subtractive methods also additive processes are known for producing the conductive traces. Thin conductive traces can, for example, be galvanically treated to produce conductors with larger vertical dimensions or thicknesses. Several printed circuit boards can be stacked to form multi-layer printed circuit boards. The conductors of the different printed circuit boards within a multi-layer printed circuit board can be connected to each other through conductive vias.

Laminar current conductors allow to bring the current close enough to the sensor on one hand and at the same time to keep the internal resistance of the conductor minimal, to optimize the thermal coupling between the current conductor and the sensor chip and to provide a strong mechanical connection through a large bonding surface which remains stable within a micrometer range over the whole lifetime of the sensor package.

The contact regions 122 and 124 have a major influence on the internal resistance of the current conductor. In certain embodiments the contact regions 122 and 124 are arranged such that the current is bent only to a minimum extent when passing from the first current conductor to the magnetic field producing region (current input) and when passing from the magnetic field producing region to a second contact region. (current output). Additionally, the contact regions typically do not change the magnetic field at the position of the magnetic field sensors even in case the exact geometry of the contact positions varies, for example because the contacts are not soldered all over or the current providing conductor is not soldered at the center of the first or second contact region.

In further embodiments, the magnetic field producing region comprises at least one slot or one diminution, or in other words at least one feature at which the current lines are bent strongly and/or the current density is increased considerably.

The circuit for a semiconductor chip 130 for measuring the magnetic field of a conductor can require, e.g. about 7 mm². Embodiments of the sensor package with current sensors for currents in a range between 20 A and 500 A, thus, can comprise internal resistances within a range of 20 $\mu\Omega$ to 200 $\mu\Omega$. The sensor chip may, for example, have lateral dimensions of 2.6 mm×2.6 mm or 2 mm (dimension in x-direction)×3.5 mm (dimension in y-direction or flow direction). The sensor packages comprising such sensor chips may comprise magnetic field producing regions with a lateral dimension of 3 mm in flow direction (x-direction) and at least 4 mm in a lateral dimension perpendicular to the flow direction of the current (y-direction). In case the magnetic field-producing region has a vertical dimension (thickness) of 0.1 mm, the resistance of the magnetic field-producing area is about 20 $\mu\Omega$ (for copper). Due to the reduced cross sections, the resistance is increased to roughly 30 $\mu\Omega$ to 50 $\mu\Omega$ depending on the form and number of the notches and slits. In addition, the contact regions have an additional own resistance and there is a further resistance portion, because the current flow from the larger contact region to the smaller magnetic field-producing region is compressed. Therefore, current conductors with a vertical thickness of 0.1 mm to 0.4 mm have resistance values of about 20 $\mu\Omega$ to 2 m$\Omega$ or 3 m$\Omega$.

Further embodiments of the magnetic field-producing region have, for example, lateral dimensions of 5 mm×5 mm. The contact regions for 20 A-current sensors are smaller, for 200 A-current sensors, each of the contact regions again covers roughly an area of 25 mm², however, typically not quadratic, but with a shorter lateral dimension in the flow direction and a longer lateral dimension perpendicular to the current flow direction.

A vertical dimension of the magnetic field producing region 126 defines how strong the magnetic field drops or decreases with an increase of the vertical distance from the current conductor surface. Therefore, the vertical dimension of the current conductor is, e.g., chosen to be larger than the vertical dimension of the insulating layer, for example the printed circuit board intermediate layer 110 or 110*i*, or any combination of or a stack of insulating layers so that sufficient magnetic field couples over the insulating layer to the magnetic field sensor.

Therefore, in one implementation the printed circuit board 110 has, e.g., a minimum vertical dimension of 100 $\mu$m, no conductive vias between the opposite main surfaces in the region below and right next to the chip and overlaps the borders of the sensor chip 130 by at least 0.2 mm.

Copper laminations used in conventional circuit boards are often plated using nickel. However, in the neighborhood of the magnetic field sensors, for example within the distance of less than 1.5 mm, materials with a coercive force of more than 1 A/m are often avoided so as to not disturb the measurement of the magnetic field.

Further embodiments of the sensor package comprise a first and a second contact region 122, 124 which are not covered by the printed circuit board intermediate layer 110. In other words the contact regions 122 and 124 are directly accessible from both sides. This is prevalent in some instances, for example, if the sensor package is bolted to massive bus bars or welded using an ultrasonic nozzle to external conductors. Further, external conductors can be welded to the contact regions using an ultrasonic nozzle, for example.

Further embodiments of the sensor package comprise a magnetic field producing region 126 with at least one structural element that effects a strong inhomogenity of the current density, for example through an increase by 150% or more (with 100% referring to the average current density at the contact area), or a strong bending of the current lines, for example by more than +/−40° compared to a main current direction or a virtual direct connection between the first contact region and the second contact region, and wherein the magnetic field sensor element is arranged right above this cavity or slot with a tolerance of +/−1.2 mm.

According to a further embodiment, a sensor chip 130 comprises a memory means for storage of calibration information, for example an EEPROM-memory (EEPROM— electrically erasable programmable memory) or some kind of analog memory like laser-trimming of resistors and the sensor package is produced in a printed circuit board panel so that a cost efficient calibration in mass production through a test-in-strip-handler (perhaps even at several temperatures) is possible. One aspect of this embodiment is that each device or sensor package has its own, individual calibration information, which accounts for position tolerances of the current conductor with respect to the magnetic field sensor elements.

According to another embodiment, the sensor package 130 is produced in a printed circuit board panel such that the PCB-panel can be isolated after an end-off-line-test, by punching or snapping the individual packages out of the PCB-panel. It should be noted that conventional sensor-packages are produced and tested in a copper panel. However, in these conventional sensor-packages the copper is too thick for isolating the individual packages easily, for example by punching. In addition, the copper forms an electric coupling of the individual devices in the copper-panel so that the individual devices cannot be powered or tested individually and independently from each other. In contrast thereto, some aspects of this disclosure use a printed circuit board as carrier for the production and producing the sensor package within a printed circuit board panel, such that the individual sensor packages cannot only be easily isolated but also individually tested within a printed circuit board panel.

According to another embodiment, the printed circuit board intermediate layer 110 is sealed at its periphery so that a dwelling of the laminar structure due to humidity or a delamination due to life cycle stress, for example cycle stress, can be avoided or limited. A sealing of the printed circuit board can be performed by finish, coating via spraying or with a foil, evaporation or molding.

According to another embodiment, the printed circuit board 110 comprises on a main surface on which the sensor chip is arranged, a thin conductor layer, for example a copper lamination, which either serves as an electrostatic shield or as contact for the sensor chip or as means for bonding the sensor chip via soldering, in particular via diffusion soldering.

According to another embodiment, the printed circuit board 110 comprises on a first main surface in which the current conductor 120 is arranged, a thin conductor layer, for example a copper lamination, which is electrically connected to the current conductor, for example by soldering, e.g. diffusion soldering, or bonding within conductive adhesive. The thin conductor layer or conductor layer can provide a particularly stable, also temperature stable, mechanical connection or can be used to self-center the printed circuit board layer relative to the current conductor through the surface tension of the solder or the adhesive.

According to another embodiment the printed circuit board 110 comprises a thin conductive layer on the second main surface on which the sensor chip is mounted, for example a copper lamination, serving as contact means for the sensor chip, wherein the integrated circuit or sensor chip is mounted face-down on the printed circuit board such that bond paths of the sensor chip are contacted to the copper lamination via solder balls, solder bumps or conductive adhesive.

According to another embodiment a printed circuit board intermediate layer 130 comprises a thin conductive layer, for example a copper lamination, on the second main surface of the chip upon which the sensor chip is mounted, wherein the sensor chip is mounted face-up on the printed circuit board and the electrical connection between the bond paths and the conductive traces on the printed circuit board is realized via bond wires. According to another embodiment, the printed circuit board intermediate layer comprises means for centering upon the current conductor, for example mating boreholes or grooves.

According to another embodiment all contact regions of the printed circuit board do not comprise a lamination with permeable materials with a relative permeability of more than 1.1 or are arranged in a distance of at minimum 1.5 mm to the magnetic field sensor elements.

According to another embodiment the contact regions of the current conductor and the contacts of the sensor chip are arranged in one plane such that the sensor package is suitable for a surface mount assembly.

According to another embodiment, the magnetic field producing region of the current conductor has a vertical dimension at its thinnest section of at least 0.2 mm.

According to a further embodiment the dielectric strength of the printed circuit board intermediate layer 130 is strengthened by a laminated polyimide layer, for example a Kapton foil, for example with a vertical dimension smaller than 0.2 mm, and in particular within a range of 50 µm to 125 µm.

According to another embodiment the sensor chip is completely surrounded by printed circuit board material. In other words, the sensor chip 130 is laminated into the printed circuit material such that the printed circuit board is not only arranged between the sensor chip and the current conductor but the sensor chip is also covered by the printed circuit board on the remaining top main surface facing away from the current conductor.

To reduce or avoid eddy currents, particular embodiments of the sensor package as described based on FIGS. 1A to 12 only comprise the printed circuit board or other dielectric layers or material between the sensor chip 130 and the magnetic field-producing area 126 and do not comprise any electrically-conductive layers, in particular, no massive conductive layers with particular dimensions of more than 100 µm (unlike typical lead frame packages). Therefore, embodiments of the sensor package with face-up mounted sensor chips, as shown in FIG. 4, do not comprise any electrically conductive layers or structures between the sensor chip 130 and the current conductor 120 and, in particular, not between any of the magnetic field sensors 132, 134 (associated to the current conductor and the magnetic field-producing region 126) and the magnetic field-producing region 126. Therefore, certain embodiments of the sensor package comprising a flip-chip mounted or top-down mounted sensor chip 130, as shown in FIG. 3, only comprise thin lateral conductive traces to connect the sensor chip, for example, to connect the power supply pins, control pins and output pins of the sensor chip 130 to other discrete electric components integrated in the sensor package or to the contact pads for the external connection of the sensor package, between the sensor chip 130 and the current conductor 120 and do not comprise any further conductive structures or layers between the sensor chip and the current conductor. In addition, these thin lateral conductive traces are not arranged between the magnetic field sensors and the magnetic field producing region.

Further embodiments of the sensor package may comprise an insulation arranged on a surface of the current conductor or additional current conductor covering a part of the surface or the entire surface. This insulation can be, e.g., a further printed circuit board layer or a solder stopping layer.

Depending on certain implementation requirements of the inventive methods, the inventive methods can be implemented in hardware or software. The implementation can be performed using a digital storage medium, in particular, a disk, a CD, a DVD or a Blu-ray disc, having an electronically-readable control signals stored thereon, which cooperates with a programmable computer system such that an embodiment of the inventive method is performed. Generally, an embodiment of the present invention is, therefore, a computer program product with a program code stored on a machine-readable carrier, the program code being operative for performing the inventive method when the computer program product runs on a computer. In other words, embodiments of the inventive method are, therefore, a computer program having a program code for performing at least one of the inventive methods when the computer program runs on a computer.

Aspects of the invention have been particularly shown and described with reference to particular embodiments thereof. It will be understood by those skilled in the art that various other changes in the form and details may be made without departing from the spirit and scope thereof. It is, therefore, to be understood that various changes may be made in adapting the different embodiments without departing from the broader concept disclosed herein and comprehended by the claims that follow.

The invention claimed is:

1. A sensor package, comprising:
 a printed circuit board that includes a first main surface and a second main surface, wherein the second main surface is opposite to the first main surface;
 a laminar current conductor arranged on the first main surface;
 a sensor chip arranged on the second main surface and electrically insulated from the laminar current conductor by the printed circuit board, wherein the sensor chip is adapted to measure a current flowing through the laminar current conductor, and wherein the sensor chip comprises a magnetic field sensor; and
 wherein the sensor chip is hermetically sealed between a mold material and the printed circuit board, or wherein the sensor chip is hermetically sealed within the printed circuit board.

2. The sensor package of claim 1, wherein the magnetic field sensor is adapted to produce a signal proportional to an intensity of the current flowing through the current conductor, and wherein the sensor package further comprises:
 an evaluation unit adapted to determine an output signal of the sensor chip representing a measure of the intensity of the current flowing through the current conductor based on the signal of the magnetic field sensor and a calibration information.

3. The sensor package of claim 2, wherein the calibration information accounts for position tolerances between the current conductor and the magnetic field sensor.

4. The sensor package according to claim 1, wherein the current conductor comprises a first contact region, a second contact region and a magnetic field producing region electrically coupled between the first and the second contact region.

5. The sensor package according to claim 4, wherein the magnetic field producing region has a vertical dimension, which is vertical relative to the first main surface of the printed circuit board, and wherein the vertical dimension of the magnetic field producing region is larger than a vertical distance between the magnetic field sensor and a surface of the current conductor facing the printed circuit board.

6. The sensor package according to claim 5, wherein the vertical dimension of the magnetic field producing region is more than 1.5 times larger than the vertical distance between the magnetic field sensor and the surface of the current conductor.

7. The sensor package according to claim 5, wherein the vertical distance between the magnetic field sensor and the current conductor is larger than 50 µm and a vertical dimension of the current conductor is larger than 100 µm.

8. The sensor package according to claim 5, wherein the current conductor is electrically insulated from the sensor chip by both: an insulating area of the printed circuit board arranged between the sensor chip and the current conductor, and an additional insulating layer arranged between the sensor chip and the current conductor.

9. The sensor package according to claim 4, wherein a maximum lateral dimension of the magnetic field producing region parallel to the first main surface of the printed circuit board and vertical to a main current flow direction of the magnetic field producing region is larger than a maximum vertical dimension of the magnetic field producing region vertical to the first main surface of the printed circuit board.

10. The sensor package according to claim 9, wherein the maximum lateral dimension of the magnetic field producing region is more than five times larger than the maximum vertical dimension of the magnetic field producing region vertical to the first main surface of the printed circuit board.

11. The sensor package according to claim 4, wherein the sensor chip is adapted to measure intensities of currents in a range of 20 A to 500 A, wherein an internal resistance of the first contact region, of the second contact region and of the magnetic field producing region is in a range between 20µOhm to 3 mOhm, and wherein a lateral area of the magnetic field producing region is larger than a lateral area of a main surface of the sensor chip.

12. The sensor package according to claim 4, wherein the magnetic field producing region comprises at least one lateral notch, and wherein the magnetic field sensor is arranged above the lateral notch and aligned to the lateral notch.

13. The sensor package of claim 1, wherein the sensor package further comprises:
 a discrete circuit element coupled between a pin of the sensor chip and an external contact of the sensor package, wherein the discrete circuit element comprises only material with a relative permeability of less than 1.1, or wherein the discrete circuit element is arranged spaced apart from the magnetic field sensor by at least 1.5 mm in case the discrete circuit element comprises material with a relative permeability of 1.1 or more.

14. The sensor package of claim 13, wherein the sensor package does not comprise any discrete circuit element with a relative permeability of more than 1.1 that is arranged in a distance smaller than 1.5 mm to any magnetic field sensor element of the sensor chip.

15. The sensor package according to claim 13, wherein the discrete circuit element is a capacitor, a fuse or a conductive lamination arranged on the printed circuit board.

16. The sensor package according to claim 1, wherein the sensor chip is at least partially embedded in the printed circuit board.

17. A sensor package, comprising:
 a printed circuit board that includes a first main surface and a second main surface, wherein the second main surface is opposite to the first main surface;
 a laminar current conductor arranged on the first main surface and adapted to carry a current having a current intensity;
 a sensor chip arranged on the second main surface and electrically insulated from the laminar current conductor by the printed circuit board, wherein the sensor chip comprises:
  a magnetic field sensor adapted to produce a signal proportional to the current intensity; and an evaluation unit adapted to evaluate the current intensity based on both the signal of the magnetic field sensor and individual calibration data, wherein the individual calibration data is individual for individual sensor packages; and wherein the sensor chip is hermetically sealed between a mold material and the printed circuit board, or wherein the sensor chip is hermetically sealed within the printed circuit board.

18. The sensor package according to claim 17, wherein the laminar current conductor comprises a first contact region, a second contact region and a magnetic field producing region electrically coupled between the first and the second contact region, and wherein a vertical dimension of the magnetic field producing region vertical to the first main surface of the printed circuit board is larger than a vertical distance vertical to the first main surface of the printed circuit board between a surface of the current conductor facing towards the sensor chip and the magnetic field sensor.

* * * * *